(12) United States Patent
Han

(10) Patent No.: US 11,508,741 B2
(45) Date of Patent: Nov. 22, 2022

(54) NONVOLATILE MEMORY DEVICE HAVING RESISTANCE CHANGE STRUCTURE

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 223 days.

(21) Appl. No.: 16/900,448

(22) Filed: Jun. 12, 2020

(65) Prior Publication Data

US 2021/0202514 A1 Jul. 1, 2021

(30) Foreign Application Priority Data

Dec. 26, 2019 (KR) ........................ 10-2019-0175778

(51) Int. Cl.
| | |
|---|---|
| *G11C 13/00* | (2006.01) |
| *H01L 27/11553* | (2017.01) |
| *H01L 27/11539* | (2017.01) |
| *G11C 16/24* | (2006.01) |
| *H01L 27/1158* | (2017.01) |

(52) U.S. Cl.
CPC .... *H01L 27/11539* (2013.01); *G11C 13/0002* (2013.01); *G11C 13/0026* (2013.01); *G11C 16/24* (2013.01); *H01L 27/1158* (2013.01); *H01L 27/11553* (2013.01)

(58) Field of Classification Search
CPC ......... H01L 27/11514; H01L 27/11551; H01L 27/11568; H01L 27/1157; H01L 27/11553; H01L 27/11556; G11C 13/002; G11C 2213/70; G11C 2213/71; G11C 2213/75; G11C 2213/79; G11C 2213/82; G11C 13/0026
See application file for complete search history.

(56) References Cited

U.S. PATENT DOCUMENTS

| | | | |
|---|---|---|---|
| 9,691,819 B2 | 6/2017 | Oh et al. | |
| 9,859,338 B2 | 1/2018 | Chen et al. | |
| 10,839,897 B1 * | 11/2020 | Bai | ..................... G11C 13/0026 |

\* cited by examiner

*Primary Examiner* — Thanhha S Pham

(57) ABSTRACT

A nonvolatile memory device according to an embodiment includes a substrate having an upper surface, a gate line structure disposed over the substrate, a gate dielectric layer covering one sidewall surface of the gate line structure and disposed over the substrate, a channel layer disposed to cover the gate dielectric layer and disposed over the substrate, a bit line structure and a resistance change structure to contact different portions of the channel layer over the substrate, and a source line structure disposed in the resistance change structure. The gate line structure includes at least one gate electrode layer pattern and interlayer insulation layer pattern that are alternately stacked along a first direction perpendicular to the substrate, and extends in a second direction perpendicular to the first direction.

18 Claims, 16 Drawing Sheets

NONVOLATILE MEMORY DEVICE HAVING RESISTANCE CHANGE STRUCTURE

CROSS-REFERENCE TO RELATED APPLICATION

The present application claims priority under 35 U.S.C. § 119(a) to Korean Patent Application No. 10-2019-0175778, filed on Dec. 26, 2019, which is herein incorporated by reference in its entirety.

BACKGROUND

1. Technical Field

The present disclosure relates generally to a nonvolatile memory device and, more particularly, to a nonvolatile memory device having a resistance change structure.

2. Related Art

As the design rule decreases and the degree of integration increases, research has continued on the structures of semiconductor devices that can guarantee both structural stability and reliability of signal storage operations. Currently, nonvolatile memory devices, such as a flash memory device employing a three-layer, stacked charge storage structure with a charge tunneling layer, a charge trap layer, and a charge barrier layer have been widely utilized.

Recently, various nonvolatile memory devices having structures different from existing flash memory devices have been proposed. An example of nonvolatile memory devices is a resistance change memory device. While a flash memory device implements a memory function through charge storage, a resistance change memory device has a memory layer in a memory cell with a variable resistance state between a high resistance state and a low resistance state, and stores the changeable resistance states in a nonvolatile manner, thereby writing predetermined signal information in the memory cell.

SUMMARY

A nonvolatile memory device according to an aspect of the present disclosure may include a substrate having an upper surface, a gate line structure disposed over the substrate, a gate dielectric layer covering one sidewall surface of the gate line structure and disposed over the substrate, a channel layer disposed to cover the gate dielectric layer and disposed over the substrate, a bit line structure and a resistance change structure, each disposed over the substrate to contact different portions of the channel layer, and a source line structure disposed in the resistance change structure. The gate line structure may include at least one gate electrode layer pattern and at least one interlayer insulation layer pattern, which are alternately stacked along a first direction perpendicular to the upper surface, and may extend in a second direction perpendicular to the first direction. The one sidewall surface of the gate line structure may be a plane defined by the first and second directions. The bit line structure and the resistance change structure may extend along the first direction and may be disposed to be spaced apart from each other in the second direction. The source line structure may extend along the first direction.

A nonvolatile memory device according to another aspect of the present disclosure may include a substrate having an upper surface, and a first and a second gate line structures disposed over the substrate. Each of the first and second gate line structures may include at least one gate electrode layer pattern and at least one interlayer insulation layer pattern, which are alternately stacked along a first direction perpendicular to the upper surface, and the first and second gate line structures may extend in a second direction perpendicular to the first direction and may be disposed to be spaced apart from each other in a third direction perpendicular to the first and second directions. The nonvolatile memory device may also include a first gate dielectric layer and a first channel layer sequentially disposed on a sidewall surface of the first gate line structure along the third direction. The nonvolatile memory device may also include a second gate dielectric layer and a second channel layer sequentially disposed on a sidewall surface of the second gate line structure along the third direction. The nonvolatile memory device may also include a first bit line structure and a first resistance change structure disposed between the first gate line structure and the second gate line structure over the substrate and disposed to contact the first and second channel layers, respectively. The nonvolatile memory device may also include a first source line structure disposed in the first resistance change structure to extend along the first direction. The first bit line structure and the first resistance change structure may be disposed to be spaced apart from each other along the second direction by a predetermined distance.

In a method of manufacturing a nonvolatile memory device according to yet another aspect of the present disclosure, a substrate may be prepared. A gate line structure including at least one gate electrode layer pattern and at least one interlayer insulation layer pattern that are alternately stacked along a first direction perpendicular to an upper surface of the substrate is formed over the substrate. The gate line structure may extend in a second direction perpendicular to the first direction. A gate dielectric layer and a channel layer that sequentially cover one sidewall surface of the gate line structure may be formed. The one sidewall surface of the gate line structure may be a plane defined by the first and second directions. A bit line structure and a resistance change structure that extend along the first direction and contact different portions of the channel layer over the substrate may be formed. A source line structure disposed in the resistance change structure and extending along the first direction may be formed. The bit line structure and the resistance change structure may be disposed to be spaced apart from each other in the second direction.

DETAILED DESCRIPTION

Figure 1:
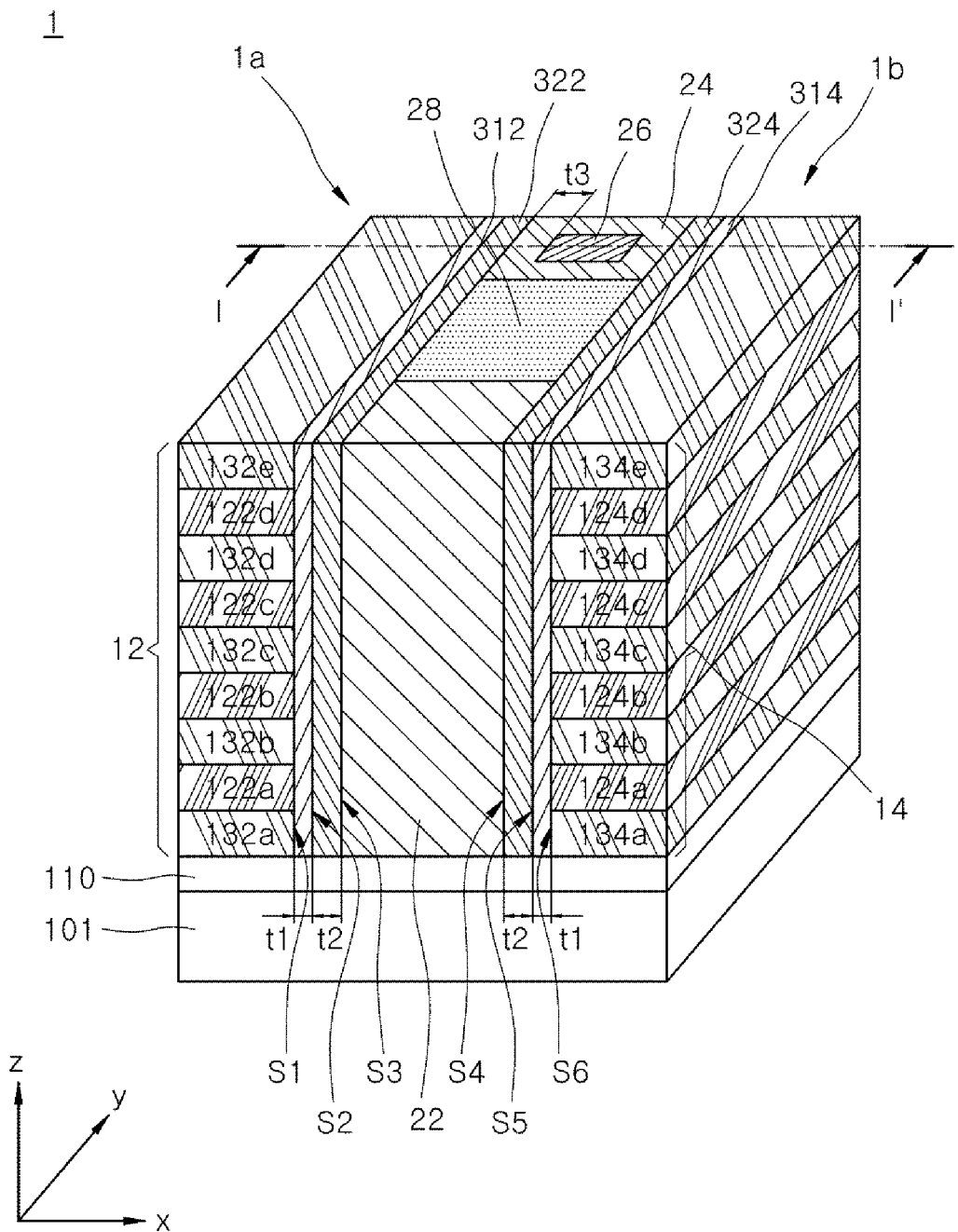
FIG. 1 is a perspective view schematically illustrating a nonvolatile memory device according to an embodiment of the present disclosure.

Hereinafter, embodiments of the present disclosure will be described in more detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the z-direction may encompass a direction parallel to the z-direction. That is, the z-direction may mean all of a direction in which an absolute value of the z-axis increases in a positive direction along the z-axis from the origin 0 and a direction in which an absolute value of the z-axis increases in a negative direction along the z-axis from the origin 0. The x-direction and the y-direction may each be interpreted in substantially the same way in the x-y-z coordinate system.

In this specification, "left" and "right" or "upper" and "low" may be interpreted as a concept of relative positions to each other from a viewpoint of a person observing the drawing.

Figure 2:
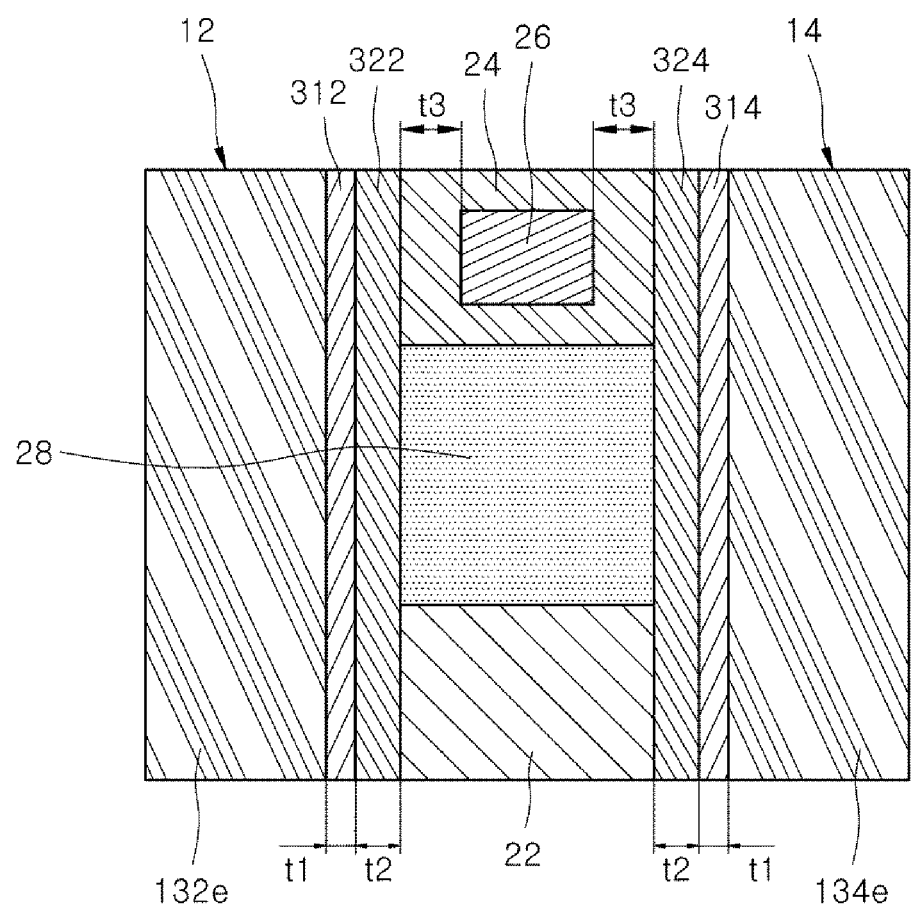
FIG. 2 is a plan view of the nonvolatile memory device of FIG. 1.
Figure 3:
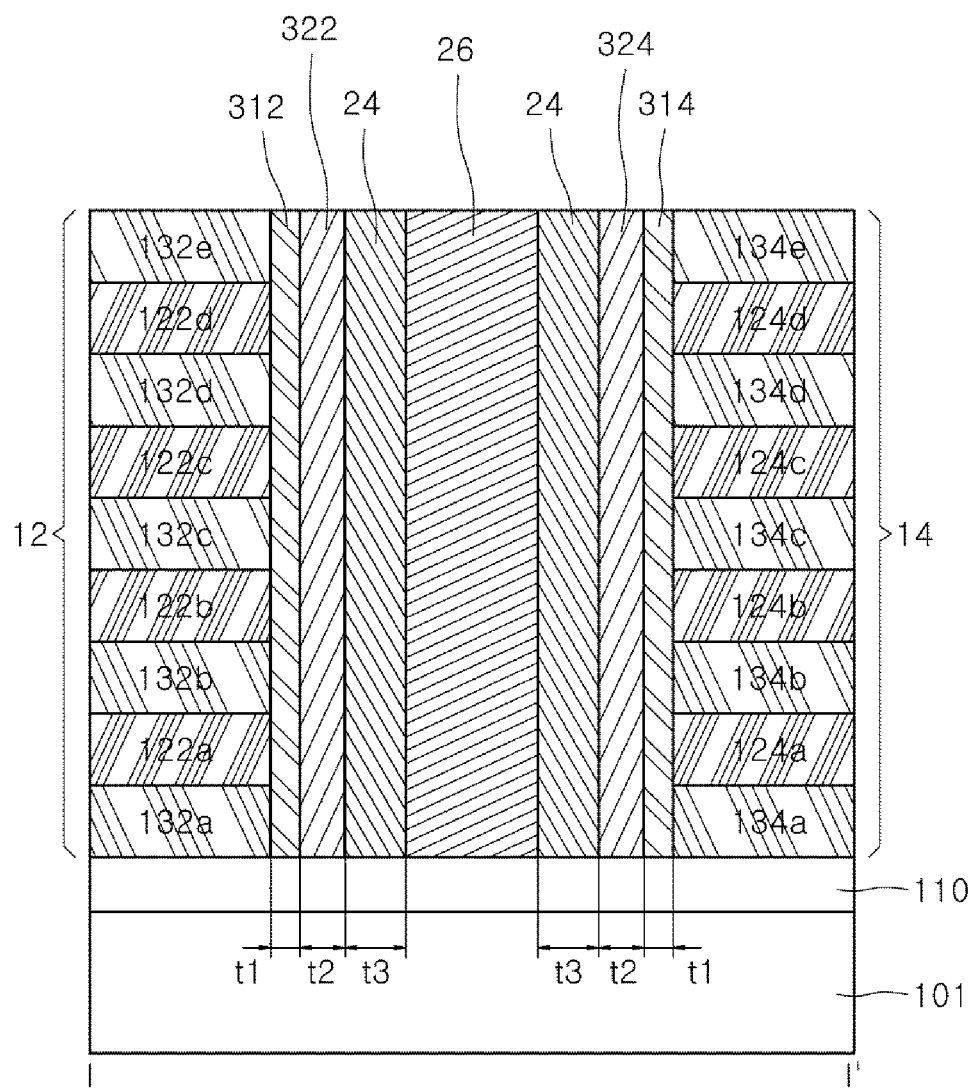
FIG. 3 is a cross-sectional view taken along a line I-I' of the nonvolatile memory device of FIG. 1.

FIG. 1 is a perspective view schematically illustrating a nonvolatile memory device according to an embodiment of the present disclosure. FIG. 2 is a plan view of the nonvolatile memory device of FIG. 1. FIG. 3 is a cross-sectional view taken along a line I-I' of the nonvolatile memory device of FIG. 1.

Referring to FIGS. 1 to 3, the nonvolatile memory device 1 may include a substrate 101, first and second gate line structures 12 and 14, a bit line structure 22, a resistance change structure 24, a source line structure 26, first and second gate dielectric layers 312 and 314, and first and second channel layers 322 and 324. The nonvolatile memory device 1 may further include a base insulation layer 110 disposed on the substrate 101 and an insulation structure 28 extending in a first direction (i.e., the z-direction) perpendicular to the substrate 101.

The nonvolatile memory device 1 may include a first memory element 1a and a second memory element 1b. The first memory element 1a may include the first gate line structure 12, the first gate dielectric layer 312 and the first channel layer 322. The second memory element 1b may include the second gate line structure 14, the second gate dielectric layer 314 and the second channel layer 324. In addition, the first and second memory elements 1a and 1b may share the bit line structure 22, the resistance change structure 24, the source line structure 26 and the insulation structure 28. The first memory element 1a and the second memory element 1b may each include a plurality of memory cells, as described below. That is, the first memory element 1a and the second memory element 1b may store different signals in the memory cells.

The substrate 101 may include a semiconductor material. Specifically, the semiconductor material may include silicon (Si), germanium (Ge), gallium arsenide (GaAs), and the like. The substrate 101 may be doped with an n-type dopant or a p-type dopant. As an example, the substrate 101 may include a well region doped with an n-type dopant or a p-type dopant.

The base insulation layer 110 may be disposed on the substrate 101. The base insulation layer 110 may electrically insulate the first and second gate line structures 12 and 14, the first and second gate dielectric layers 312 and 314, the first and second channel layers 322 and 324, the bit line structure 22 and the source line structure 24 from the substrate 101, respectively.

Although not illustrated in FIG. 1, at least one conductive layer and at least one insulation layer may be disposed between the substrate 101 and the base insulation layer 110. The conductive layer and the insulation layer may form various circuit patterns. That is, the conductive layer and the insulation layer may form a plurality of wirings or may constitute a passive element such as a capacitor or a resistor, or an active element such as a diode or a transistor, by way of non-limiting examples.

The first gate line structure 12 may be disposed on the base insulation layer 110. The first gate line structure 12 may include first to fourth gate electrode layer patterns 122a, 122b, 122c and 122d and first to fifth interlayer insulation layer patterns 132a, 132b, 132c, 132d and 132e, which are alternately stacked along a first direction (i.e., the z-direction) perpendicular to an upper surface of the substrate 101, on the base insulation layer 110. The first interlayer insulation layer pattern 132a may be disposed to contact the base insulation layer 110. The fifth interlayer insulation layer pattern 132e may be disposed as an uppermost layer of the first gate line structure 12.

The first gate line structure 12 may extend in a second direction (i.e., the y-direction) perpendicular to the first direction (i.e., the z-direction). The first to fourth gate electrode layer patterns 122a, 122b, 122c and 122d may be electrically insulated from each other by the first to fifth interlayer insulation layer patterns 132a, 132b, 132c, 132d and 132e. The first to fourth gate electrode layer patterns 122a, 122b, 122c and 122d may each be a conductive line extending in the second direction (i.e., the y-direction). The first to fourth gate electrode layer patterns 122a, 122b, 122c and 122d may each maintain a predetermined electric potential. The electric potential of each of the first to fourth gate electrode layer patterns 122a, 122b, 122c and 122d may be independently or separately controlled.

In an embodiment, the first to fourth gate electrode layer patterns 122a, 122b, 122c and 122d may each include a conductive material. The conductive material may, for example, include a doped semiconductor material, metal, conductive metal nitride, conductive metal carbide, conductive metal silicide, or conductive metal oxide. The conductive material may, for example, include n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The first to fifth interlayer insulation layer patterns 132a, 132b, 132c, 132d and 132e may each include an insulative material. The insulative material may, for example, include oxide, nitride, oxynitride, and the like.

In some other embodiments, the number of the gate electrode layer patterns of the first gate line structure 12 may not necessarily be limited to four. The gate electrode layer patterns may be disposed in various numbers, and the interlayer insulation layer patterns may insulate the various numbers of gate electrode layer patterns along the first direction (i.e., the z-direction).

Referring to FIGS. 1 to 3, the first gate dielectric layer 312 may be disposed on the base insulation layer 110 and on one sidewall surface 51 of the first gate line structure 12. Here, the one sidewall surface 51 may form a plane defined by the first and second directions (i.e., a y-z plane of an z-direction and a y-direction). The first gate dielectric layer 312 may have a predetermined thickness t1 along a third direction (i.e., the x-direction) perpendicular to the first and second directions. The thickness t1 may, for example, be 1 nanometer (nm) to 30 nanometers (nm), inclusive.

The first gate dielectric layer 312 may include a dielectric material. The dielectric material may, for example, include silicon oxide, silicon nitride, silicon oxynitride, aluminum oxide, hafnium oxide, and the like. The dielectric material may, for example, have a paraelectric property.

The first channel layer 322 may be disposed on the base insulation layer 110 and to contact the first gate dielectric layer 312.

Specifically, the first channel layer 322 may be disposed on one surface S2 of the first gate dielectric layer 312, defined by the first and second directions (i.e., the z-direction and y-direction). The first channel layer 322 may have a predetermined thickness t2 along the third direction (i.e., the x-direction). The thickness t2 may, for example, be 1 nanometer (nm) to 50 nanometers (nm), inclusive.

The first channel layer 322 may provide an electrical path through which electrical carriers move from the bit line structure 22 to the source line structure 26. As described later, when a voltage equal to or greater than a threshold voltage is applied to at least one of the first to fourth gate electrode layer patterns 122a, 122b, 122c and 122d, a conductive channel having a low resistance may be formed in a portion of the first channel layer 322 that overlaps, when viewed along the x-direction, the gate electrode layer pattern to which the voltage is applied. The electrical carriers can move through the conductive channel between the bit line structure 22 and the source line structure 26. The electrical carriers may include electrons or holes.

The first channel layer 322 may, for example, include a semiconductor material. The semiconductor material may, for example, include silicon (Si), germanium (Ge), gallium arsenide (GaAs), and the like. As another example, the semiconductor material may include a two-dimensional semiconductor material. The two-dimensional semiconductor material may include transition metal dichalcogenide (TMDC), black phosphorus, or the like. The transition metal dichalcogenide may, for example, include molybdenum selenide (MoSe2), hafnium selenide (HfSe2), indium selenide (InSe), gallium selenide (GaSe), and the like. As an example, the semiconductor material may include a metal oxide such as indium-gallium-zinc (In—Ga—Zn) oxide (IGZO). The indium-gallium-zinc oxide (IGZO) may be c-axis aligned indium-gallium-zinc (In—Ga—Zn) oxide. The first channel layer 322 may have a single crystal structure or a polycrystalline structure.

Referring again to FIGS. 1 to 3, the bit line structure 22 and the resistance change structure 24 may each be disposed on the base insulation layer 110. The bit line structure 22 and the resistance change structure 24 may each be disposed to contact a surface S3 of the first channel layer 322. The bit line structure 22 and the resistance change structure 24 may be spaced apart from each other in the second direction (i.e., the y-direction). Consequently, the bit line structure 22 and the resistance change structure 24 may each contact different portions of surface S3 common to the first channel layer 322. The bit line structure 22 and the resistance change structure 24 may each have a pillar-like shape extending along the first direction (i.e., the z-direction). The bit line structure 22 and the resistance change structure 24 may each contact the second channel layer 324 along the third direction (i.e., the x-direction).

The bit line structure 22 may include a conductive material. The conductive material may, for example, include a doped semiconductor material, metal, conductive metal nitride, conductive metal carbide, conductive metal silicide, or conductive metal oxide. The conductive material may, for example, include silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The resistance change structure 24 may include a variable resistance material. In the variable resistance material, an internal resistance state may be variably changed according to a polarity or a magnitude of a voltage applied to the variable resistance material, and the changed internal resistance state may be stored in a non-volatile manner after the applied voltage is removed. As an example, the variable resistance material may have an internal resistance state of high resistance and an internal resistance state of low resistance that vary according to the polarity or magnitude of the voltage. The high resistance and the low resistance may mean relative resistance values that are distinguished from each other.

In an embodiment, the variable resistance material may include oxide having oxygen vacancies. The oxide may, for example, include titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. In other embodiments, the variable resistance material may include, for example, PCMO ($Pr_{1-x}Ca_xMnO_3$, $0<x<1$), LCMO ($La_{1-x}Ca_xMnO_3$, $0<x<1$), BSCFO ($Ba_{0.5}Sr_{0.5}Co_{0.8}Fe_{0.2}O_{3-\delta}$), YBCO ($YB_{a2}Cu_3O_{7-x}$, $0<x<1$), (Ba, Sr)$TiO_3$ doped with chromium (Cr) or niobium (Nb), $SrZrO_3$ doped with chromium (Cr) or vanadium (V), (La, Sr) $MnO_3$, $Sr_{1-x}La_xTiO_3$ (0<x<1), $La_{1-x}Sr_xFeO_3$ (0<x<1), $La_{1-x}Sr_xCoO_3$ (0<x<1), $SrFeO_{2.7}$, $LaCoO_3$, $RuSr_2GdCu_2O_3$, $YB_{a2}Cu_3O_7$, or a combination of two or more thereof. As another example, the variable resistance material may include germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), GexSe1-x (0<x<1), silver sulfide ($Ag_2S$), copper sulfide ($Cu_2S$), Cadmium sulfide (CdS), zinc sulfide (ZnS), and selenium oxide ($CeO_2$), or a combination of two or more thereof.

Referring again to FIG. 1, the source line structure 26 may be disposed inside the resistance change structure 24. That is, the resistance change structure 24 may be disposed to surround the source line structure 26 by a predetermined thickness t3 along the third direction (i.e., the x-direction). The thickness t3 may, for example, be 1 nanometer (nm) to 100 nanometers (nm), inclusive.

The source line structure 26 may include a conductive material. The conductive material may, for example, include a doped semiconductor material, metal, conductive metal nitride, conductive metal carbide, conductive metal silicide, or conductive metal oxide. The source line structure 26 may include substantially the same material as the bit line structure 22.

The insulation structure 28 may be disposed, on the substrate 101, between the bit line structure 22 and the resistance change structure 24. The insulation layer 28 may be disposed to contact the bit line structure 22, the resistance change structure 24, the first channel layer 322 and the second channel layer 324. The insulation structure 28 may have a pillar-like shape extending, from the base insulation layer 110, in the first direction (i.e., the z-direction). The insulation structure 28 may function to suppress the electric carriers from moving between the bit line structure 22 and the source line structure 26 through paths other than the first channel layer 322 or the second channel layer 324. The insulation structure 28 may include oxide, nitride or oxynitride. As an example, the insulation structure 28 may include silicon oxide, silicon nitride or silicon oxynitride.

The bit line structure 22 and the source line structure 26 may each maintain a predetermined electric potential. The electric potentials of the bit line structure 22 and the source line structure 26 may each be independently or separately controlled. In an embodiment, during a write operation of the nonvolatile memory device, when a conductive channel is formed in the first channel layer 322 or the second channel layer 324, and a predetermined voltage is applied between the bit line structure 22 and the source line structure 26, the electrical carriers may move through the conductive channel. In addition, depending on the predetermined voltage, the electrical resistance of the resistance change structure 24 positioned between a conductive channel and the source line structure 26 may be changed. The changed electrical resistance may be stored in the resistance change structure 24 as signal information.

Referring to FIGS. 1 to 3, the second channel layer 324 may be disposed on the base insulation layer 110 to contact the sidewall surfaces of the bit line structure 22, the resistance change structure 24, and the insulation structure 28. The sidewall surfaces of the bit line structure 22, the resistance change structure 24, and the insulation structure 28 may be positioned on the same plane S4. The plane S4 may be a plane defined by the first and second directions (i.e., the z-direction and y-direction). That is, the second channel layer 324 may be disposed on the plane S4.

The second channel layer 324 may have a predetermined thickness t2 along the third direction (i.e., the x-direction). A configuration of the second channel layer 324 may be substantially the same as a configuration of the first channel layer 322.

The second gate dielectric layer 314 may be disposed on one surface S5 of the second channel layer 324. The one surface S5 may be a plane defined by the first and second directions (i.e., the z-direction and y-direction). The second gate dielectric layer 314 may have a predetermined thickness t1 along the third direction (i.e., the x-direction). A configuration of the second gate dielectric layer 314 may be substantially the same as a configuration of the first gate dielectric layer 312.

The second gate line structure 14 may be disposed on the base insulation layer 110 to contact one surface S6 of the second gate dielectric layer 314. The second gate line structure 14 may include first to fourth gate electrode layer patterns 124a, 124b, 124c and 124d and first to fifth interlayer insulation layer patterns 134a, 134b, 134c, 134d and 134e, which are alternately stacked along the first direction (i.e., the z-direction) on the base insulation layer 110. The first interlayer insulation layer pattern 134a may be disposed to contact the base insulation layer 110. The fifth interlayer insulation layer pattern 134e may be disposed as an uppermost layer of the second gate line structure 14. The second gate line structure 14 may extend in the second direction (i.e., the y-direction). The configurations of the first to fourth gate electrode layer patterns 124a, 124b, 124c and 124d and the first to fifth interlayer insulation layer patterns 134a, 134b, 134c, 134d and 134e may be substantially the same as the configurations of the first to fourth gate electrode layer patterns 122a, 122b, 122c and 122d and the first to fifth interlayer insulation layer patterns 132a, 132b, 132c, 132d and 132e of the first gate line structure 12.

As described above, in the nonvolatile memory device 1 according to an embodiment of the present disclosure, the first gate line structure 12 and the second gate line structure 14 may be symmetrically disposed left and right, the first gate dielectric layer 312 and the second gate dielectric layer 314 may be symmetrically disposed left and right, and the first channel layer 322 and the second channel layer 324 may be symmetrically disposed left and right, across a y-z plane bisecting the bit line structure 22, the insulation structure 28, the resistance change structure 24 and the source line structure 26.

In an embodiment, the first memory element 1a and the second memory element 1b may each constitute different operation units. That is, the first memory element 1a may constitute one operation unit of the nonvolatile memory device 1, and the second memory element 1b may constitute another operation unit of the nonvolatile memory device 1. The bit line structure 22 and the source line structure 26 may be shared by the different operation units. In addition, as described below with reference to FIG. 4A, the first and second memory elements 1a and 1b may respectively store signals in different portions of the resistance change structure 24. As an example, the first memory element 1a may use a portion of the resistance change structure 24 adjacent to the first channel layer 322 as a memory area. The second memory element 1b may use a portion of the resistance change structure 24 adjacent to the second channel layer 324 as a memory area.

The electric potentials of the first to fourth gate electrode layer patterns 122a, 122b, 122c and 122d of the first gate line structure 12 may each be independently or separately controlled. In an embodiment, when an operation voltage is applied to at least one of the first to fourth gate electrode layer patterns 122a, 122b, 122c and 122d of the first gate line structure 12, the portion of the first gate dielectric layer 312, the portion of the first channel layer 322, the portion of the bit line structure 22, the portion of the resistance change structure 24, and the portion of the source line structure 26 that overlap, along the x-direction, the electrode layer patterns to which the operation voltage is applied may participate in a memory operation. Likewise, the electric potentials of the first to fourth gate electrode layer patterns 124a, 124b, 124c and 124d of the second gate line structure 14 may each be independently or separately controlled. When an operation voltage is applied to at least one of the first to fourth gate electrode layer patterns 124a, 124b, 124c and 124d of the second gate line structure 14, the portion of the second gate dielectric layer 314, the portion of the second channel layer 324, the portion of the bit line structure 22, the portion of the resistance change structure 24, and the portion of the source line structure 26 that overlap, along the x-direction, the electrode layer patterns to which the operating voltage is applied may participate in a memory operation.

Figure 4A:
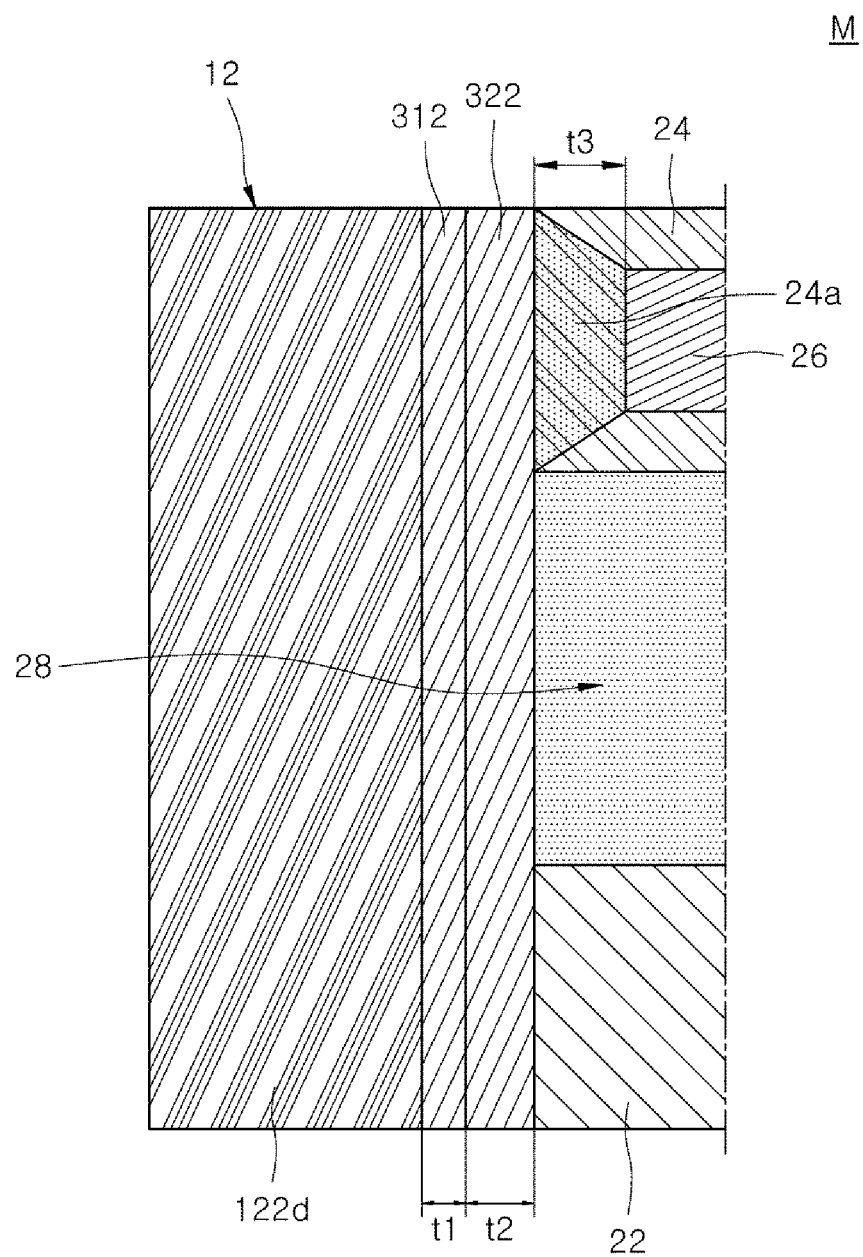
FIGS. 4A and 4B are views schematically illustrating an operation of a memory element according to an embodiment of the present disclosure.
Figure 4B:
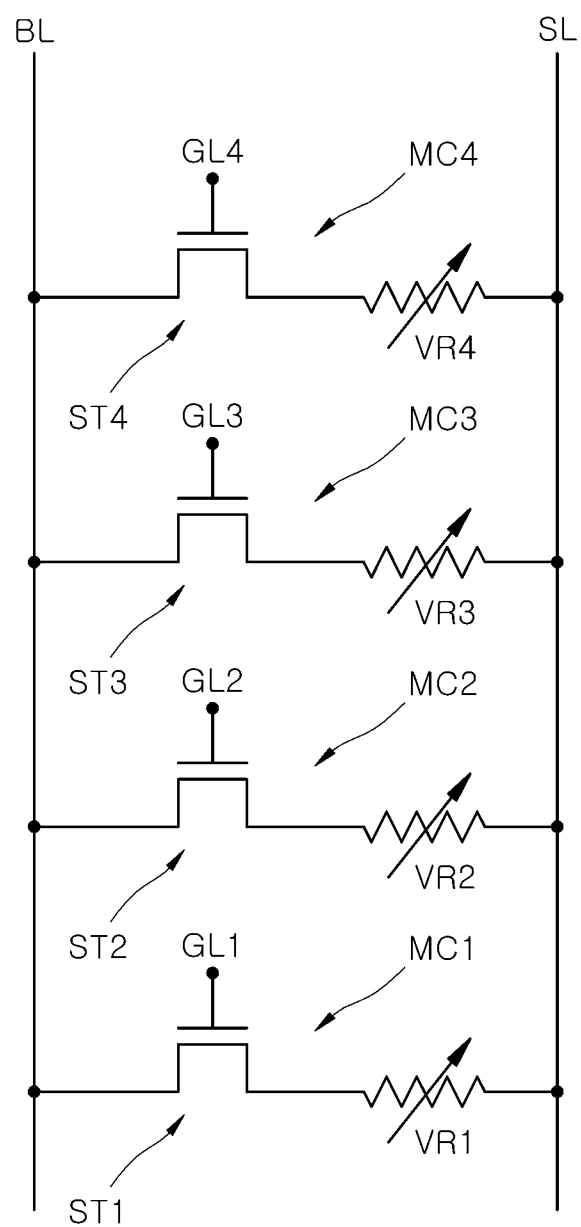

FIGS. 4A and 4B are views schematically illustrating an operation of a memory element according to an embodiment of the present disclosure. Specifically, FIG. 4A is a plan view of a memory element according to an embodiment of the present disclosure, and FIG. 4B is a circuit diagram of the memory element, corresponding to the plan view of FIG. 4A.

As illustrated in FIGS. 1 to 3, the nonvolatile memory device 1 according to an embodiment may have a first memory element 1a and a second memory element 1b. Hereinafter, the operation of the memory element M of FIG. 4A will be described using the first memory element 1a of the nonvolatile memory device 1 of FIGS. 1 to 3. Meanwhile, the operation method of the second memory element 1b of the nonvolatile memory device 1 may also be substantially the same as the operation method of the first memory element 1a. For convenience of explanation related to the operation of the memory element 1a, in FIG. 4A, an uppermost gate insulation layer pattern 134e of a first gate line structure 12 is omitted, and a fourth gate electrode layer pattern 122d is illustrated.

Referring to FIGS. 4A and 4B, the first memory element 1a may include first to fourth memory cells MC1, MC2, MC3 and MC4. First to fourth gate electrode layer patterns 122a, 122b, 122c and 122d of the first gate line structure 12 shown in FIGS. 1 to 3 and FIG. 4A may correspond to first to fourth gate electrodes GL1, GL2, GL3 and GL4 of FIG. 4B, respectively. A bit line structure 22 and a source line structure 26 shown in FIG. 4A may correspond to a bit line BL and a source line SL of FIG. 4B, respectively.

Referring to FIGS. 1 to 3 and FIG. 4A, portions of the first gate dielectric layer 312 and the first channel layer 322 that overlap the first gate electrode layer pattern 122a may constitute a first switching transistor ST1 together with the first gate electrode layer pattern 122a. Portions of the bit line structure 22, the resistance change structure 24, and the source line structure 26 that overlap the first gate electrode layer pattern 122a may constitute a first resistance change element VR1.

Likewise, portions of the first gate dielectric layer 312 and the first channel layer 322 that overlap the second gate electrode layer pattern 122b may constitute a second switching transistor ST2 together with the second gate electrode layer pattern 122b. Portions of the bit line structure 22, the resistance change structure 24, and the source line structure 26 that overlap the second gate electrode layer pattern 122b may constitute a second resistance change element VR2.

Similarly, portions of the first gate dielectric layer 312 and the first channel layer 322 that overlap the third gate electrode layer pattern 122c may constitute a third switching transistor ST3 together with the third gate electrode layer pattern 122c. Portions of the bit line structure 22, the resistance change structure 24, and the source line structure 26 that overlap the third gate electrode layer pattern 122c may constitute a third resistance change element VR3.

Likewise, portions of the first gate dielectric layer 312 and the first channel layer 322 that overlap the fourth gate electrode layer pattern 122d may constitute a fourth switching transistor ST4 together with the fourth gate electrode layer pattern 122d. Portions of the bit line structure 22, the resistance change structure 24, and the source line structure 26 that overlap the fourth gate electrode layer pattern 122d may constitute a fourth resistance change element VR4.

Meanwhile, write operations for the first to fourth memory cells MC1, MC2, MC3 and MC4 may proceed as follows. As an example, a write operation for the fourth memory cell MC4 will be described with reference to FIG. 4B. The write operations for the first to third memory cells MC1, MC2 and MC3 may also be performed in the same manner as the write operation for the fourth memory cell MC4.

Referring to FIG. 4B, the fourth gate electrode GL4 may be selected from the first to fourth gate electrodes GL1, GL2, GL3 and GL4. When a switching voltage having a magnitude equal to or greater than a predetermined threshold voltage is applied through the fourth gate electrode GL4, a conductive channel may be formed in a channel layer of the fourth switching transistor ST4. Subsequently, a write voltage may be applied between the bit line BL and the source line SL. The write voltage may be applied to the fourth resistance change element VR4 through the conductive channel. When an absolute value of the write voltage is equal to or greater than an absolute value of a set voltage or a reset voltage of the fourth resistance change element VR4, an internal resistance state of the fourth resistance change element VR4 may vary or change to a different state.

Meanwhile, the fourth resistance change element VR4 may have a plurality of internal resistance states that are distinguished from each other, for example, a high resistance state and a low resistance state. The number of high resistance states and low resistance states may each be at least two or more. However, for convenience of description, an example in which the fourth resistance change element VR4 has one high resistance state and one low resistance state that are distinguished from each other will be described below. When the absolute value of the write voltage is equal to or greater than the absolute value of the set voltage, the internal resistance state of the fourth resistance change element VR4 may be changed to a low resistance state. As another example, when the absolute value of the write voltage is equal to or greater than the absolute value of the reset voltage, the internal resistance state of the fourth resistance change element VR4 may be changed to a high resistance state. Even after the write voltage is removed, the internal resistance state of the fourth resistance change element VR4 may be retained as the changed resistance state. Accordingly, the high resistance state or the low resistance state may be stored as signal information in a non-volatile manner.

Meanwhile, referring again to FIG. 4A, the above-described write operation for the fourth memory cell MC4 will be described again. The switching voltage may be applied to the fourth gate electrode layer pattern 122d. As a result, a conductive channel may be formed in the first channel layer 322 overlapping the fourth gate electrode layer pattern 122d along the third direction (i.e., the x-direction). At this time, a write voltage may be applied between the bit line structure 22 and the source line structure 26. As an example, as a method of applying the write voltage, methods of applying different electric potentials to the bit line structure 22 and the source line structure 26 may be used.

Meanwhile, the write voltage may be applied to a first operation region 24a of the resistance change structure 24, positioned between the conductive channel and the source line structure 26. The first operation region 24a of the resistance change structure 24 may include a portion of the resistance change structure 24, positioned in a region where the conductive channel and the source line structure 26 overlap each other. Also, the first operation region 24a of the resistance change structure 24 may include a portion in which an electric field is formed in the resistance change structure by the write voltage.

When an absolute value of the write voltage is equal to or greater than an absolute value of a set voltage or an absolute value of a reset voltage of the resistance change structure 24, the internal resistance state of the first operation region 24a may be changed. When the absolute value of the write voltage is equal to or greater than the absolute value of the set voltage, the internal resistance state of the first operation region 24a may be changed to a low resistance state. As another example, when the absolute value of the write voltage is equal to or greater than the absolute value of the reset voltage, the internal resistance state of the first operation region 24a may be changed to a high resistance state. After the write voltage is removed, the internal resistance state of the first operation region 24a may be maintained as the changed resistance states, high or low. As a result, the high resistance state or the low resistance state may be stored in a non-volatile manner in the first operation region 24a as signal information.

Meanwhile, a method of reading a signal that is stored in the first to fourth memory cells MC1, MC2, MC3 and MC4 may be performed as follows. As an example, a process of reading a signal stored in the fourth memory cell MC4 will be described with reference to FIG. 4B. First, the fourth gate electrode GL4 corresponding to the fourth memory cell MC4 may be selected. Subsequently, a switching voltage equal to or greater than a predetermined threshold voltage may be applied to a gate electrode of the fourth memory cell MC4 through the fourth gate electrode GL4. The switching transistor ST4 of the fourth memory cell MC4 may be turned on and a conductive channel may be formed in a channel layer of the fourth switching transistor ST4 by the switching voltage. Subsequently, a read voltage may be applied between the bit line BL and the source line SL. At this time, the read voltage may be applied to the fourth resistance change element VR4 through the conductive channel. Consequently, the read voltage may have a magnitude that does not change the state of the internal resistance stored in the fourth resistance change element VR4.

The state of the internal resistance of the fourth resistance change element VR4 can be read by measuring the electrical resistance or a current amount of the fourth resistance change element VR4 using the read voltage. As a result, the signal information stored in the fourth resistance change element VR4 can be identified.

Referring again to FIG. 4A, a read operation of the fourth memory cell MC4 will be described. The switching voltage may be applied to the fourth electrode layer pattern 122d. In accordance with this, a conductive channel may be formed in the first channel layer 322 overlapping the fourth electrode layer pattern 122d in the third direction (i.e., the x-direction). At this time, a read voltage may be applied between the bit line structure 22 and the source line structure 26. In an embodiment, applying the read voltage may be performed by applying different electric potentials to the bit line structure 22 and the source line structure 26 with each other.

The read voltage may be applied to the first operation region 24a of the resistance change structure 24, positioned between the conductive channel and the source line structure 26. The electrical resistance of the first operation region 24a of the resistance change structure 24 can be measured by the read voltage. As a result, the internal resistance state of the first operation region 24a of the resistance change structure 24 can be read. Accordingly, the signal information stored in the first operation region 24a of the resistance change structure 24 can be identified.

As described above, the operation method of the memory element M can be described using the first memory element 1a. Referring again to FIGS. 1 to 3, the second memory element 1b may operate independently of the first memory element 1a. In this case, the second memory element 1b may have a second operation region of the resistance change structure 24, and the second operation region may include a region between the source line structure 26 and the second channel layer 324. That is, the second operation region may include a portion of the resistance change structure 24, overlapping the first to fourth gate electrode layer patterns 124a, 124b, 124c and 124d of the second gate line structure 14 in the third direction (i.e., the x-direction). In addition, the second operation region may include a portion in which an electric field is formed in the resistance change structure 24 by a write voltage applied between the bit line structure 22 and the source line structure 26 after the conductive channel is formed in the second channel layer 324.

Figure 5A:
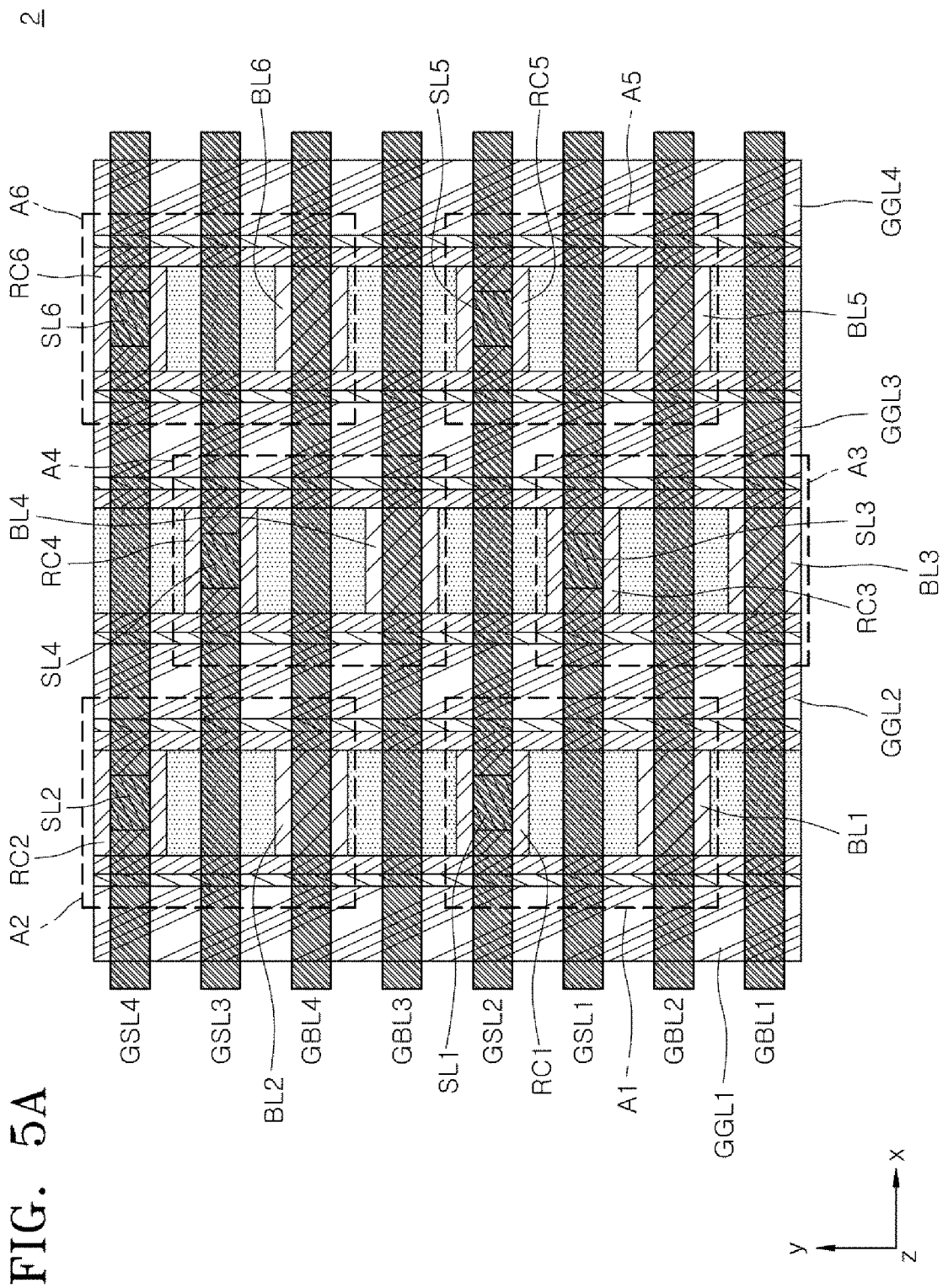
FIGS. 5A and 5B are plan views of nonvolatile memory devices according to other embodiments of the present disclosure.
Figure 5B:
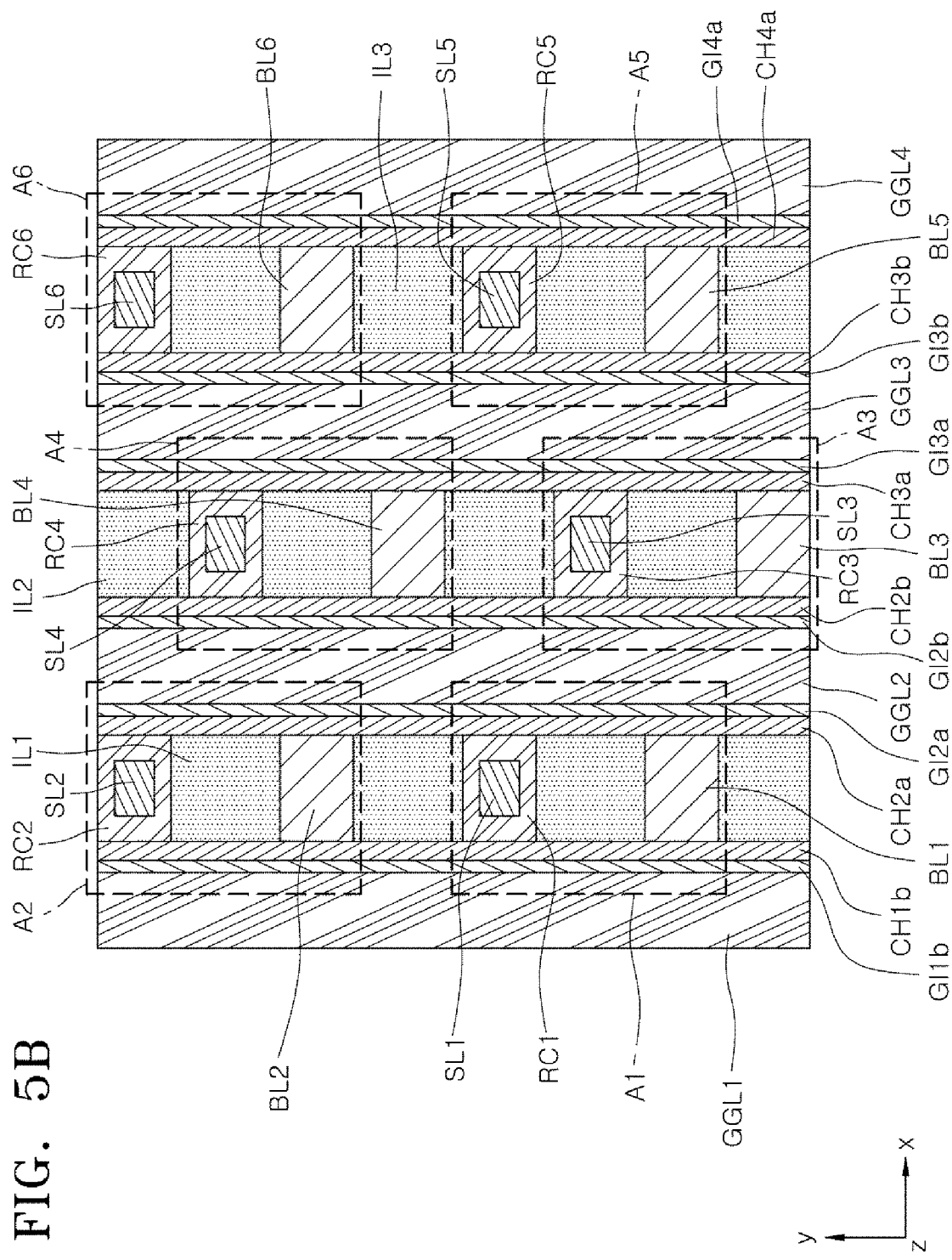
Figure 6A:
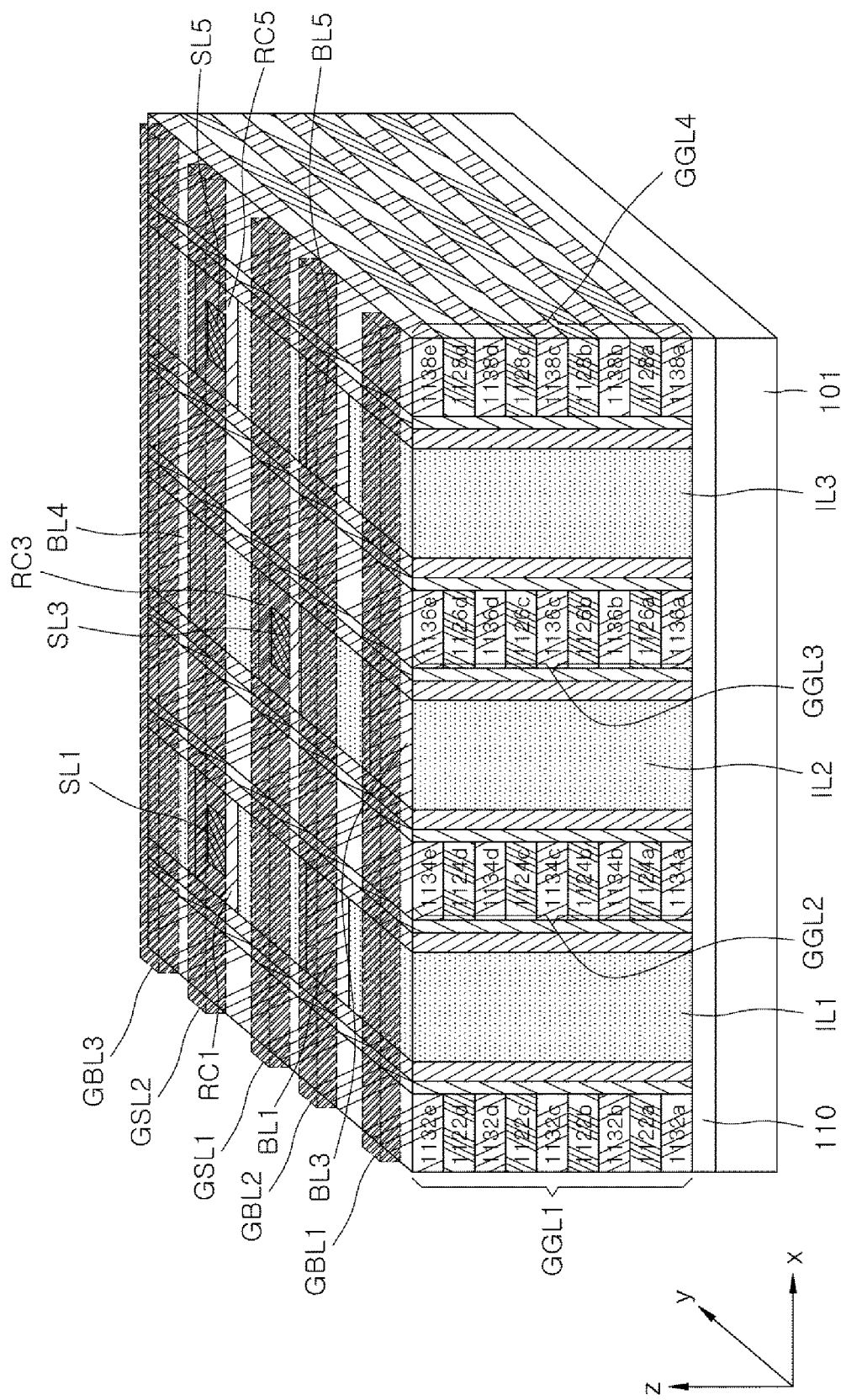
FIGS. 6A and 6B are perspective views corresponding to portions of the nonvolatile memory devices of FIGS. 5A and 5B.
Figure 6B:
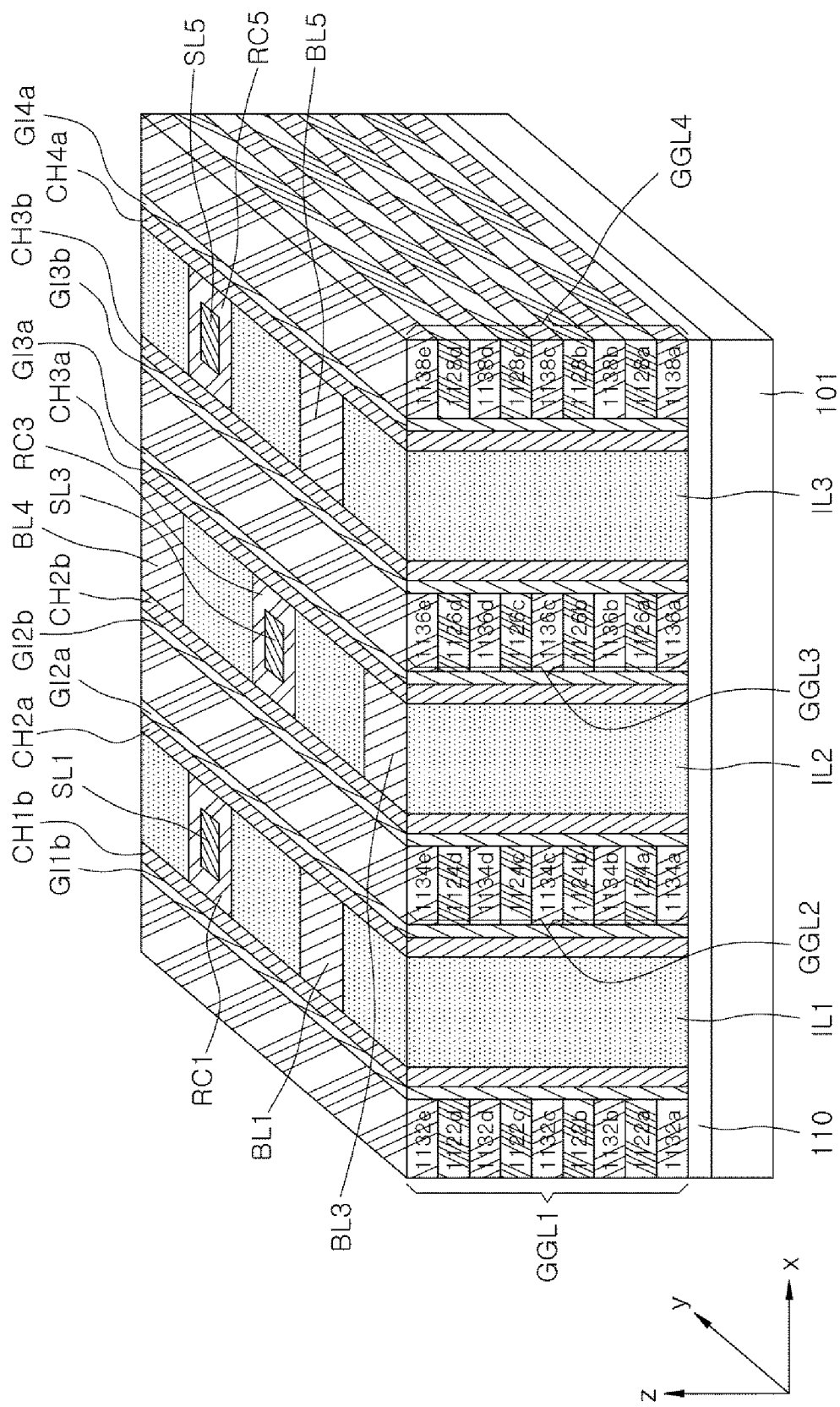

FIGS. 5A and 5B are plan views schematically illustrating a nonvolatile memory device according to another embodiment of the present disclosure. For convenience of description, FIG. 5B is a plan view in which global bit lines GBL1, GBL2, GBL3 and GBL4 and global source lines GSL1, GSL2, GSL3 and GSL4 of the nonvolatile memory device 2 of FIG. 5A are omitted. FIGS. 6A and 6B are perspective views corresponding to portions of the nonvolatile memory device of FIGS. 5A and 5B, respectively.

Referring to FIGS. 5A and 5B, the nonvolatile memory device 2 may include first to sixth units A1, A2, A3, A4, A5 and A6 arranged in a second direction (i.e., the y-direction) and a third direction (i.e., the x-direction). The first to sixth units A1, A2, A3, A4, A5 and A6 may each have substantially the same configuration. Each of first to sixth units A1, A2, A3, A4, A5 and A6 may have substantially the same configuration as the nonvolatile memory device 1 described above with reference to FIGS. 1 to 3, respectively.

In FIGS. 5A and 5B, as an embodiment, the nonvolatile memory device 2 is illustrated to include six units, but may not necessarily be limited thereto. The nonvolatile memory device 2 may have a different number of units arranged in both the second direction (i.e., the y-direction) and the third direction (i.e., the x-direction).

FIG. 6A is a perspective view of a portion including a first unit A1, a third unit A3 and a fifth unit A5 in the nonvolatile memory device of FIG. 5A. FIG. 6B is a perspective view of a portion including the first unit A1, the third unit A3 and the fifth unit A5 in the nonvolatile memory device of FIG. 5B.

Referring to FIGS. 5A, 5B, 6A and 6B, first to fourth global gate line structures GGL1, GGL2, GGL3 and GGL4 extending in the second direction (i.e., the y-direction) are disclosed. The first to fourth global gate line structures GGL1, GGL2, GGL3 and GGL4 may be disposed to be spaced apart from each other in the third direction (i.e., the x-direction) and may each be disposed in parallel in the second direction (i.e., the y-direction).

Referring to FIGS. 6A and 6B, the first global gate line structure GGL1 may include first to fourth gate electrode layer patterns 1122a, 1122b, 1122c and 1122d and first to fifth interlayer insulation layer patterns 1132a, 1132b, 1132c, 1132d and 1132e, which are alternately stacked on the base insulation layer 110 along the first direction (i.e., the z-direction). The second global gate line structure GGL2 may include first to fourth gate electrode layer patterns 1124a, 1124b, 1124c and 1124d and first to fifth interlayer insulation layer patterns 1134a, 1134b, 1134c, 1134d and 1134e, which are alternately stacked on the base insulation layer 110 along the first direction (i.e., the z-direction). The third global gate line structure GGL3 may include first to fourth gate electrode layer patterns 1126a, 1126b, 1126c and 1126d and first to fifth interlayer insulation layer patterns 1136a, 1136b, 1136c, 1136d and 1136e, which are alternately stacked on the base insulation layer 110 along the first direction (i.e., the z-direction). The fourth global gate line structure GGL4 may include first to fourth gate electrode layer patterns 1128a, 1128b, 1128c and 1128d and first to fifth interlayer insulation layer patterns 1138a, 1138b, 1138c, 1138d and 1138e, which are alternately stacked on the base insulation layer 110 along the first direction (i.e., the z-direction). The configuration of each of the first to fourth global gate line structures GGL1, GGL2, GGL3 and GGL4 may be substantially the same as the configuration of the first gate line structure 12 or the second gate line structure 14 described above with reference to FIGS. 1 to 3.

Referring to FIGS. 5A, 5B, 6A and 6B, a first right gate dielectric layer GI1b and a first right channel layer CH1b may be disposed on the base insulation layer 110 to sequentially, in the x-direction, cover a right sidewall surface of the first global gate line structure GGL1. Although not illustrated in FIGS. 5A, 5B, 6A and 6B, a first left gate dielectric layer and a first left channel layer may be disposed to sequentially, in the x-direction, cover a left sidewall surface of the first global gate line structure GGL1.

Likewise, a second left gate dielectric layer GI2a and a second left channel layer CH2a may be disposed on the base insulation layer 110 to sequentially, in the x-direction, cover a left sidewall surface of the second global gate line structure GGL2. In addition, a second right gate dielectric layer GI2b and a second right channel layer CH2b may be disposed on the base insulation layer 110 to sequentially, in the x-direction, cover a right sidewall surface of the second global gate line structure GGL2.

Similarly, a third left gate dielectric layer GI3a and a third left channel layer CH3a may be disposed on the base insulation layer 110 to sequentially, in the x-direction, cover a left sidewall surface of the third global gate line structure GGL3. In addition, a third right gate dielectric layer GI3b and a third right channel layer CH3b may be disposed on the base insulation layer 110 to sequentially, in the x-direction, cover a right sidewall surface of the third global gate line structure GGL3.

Likewise, a fourth left gate dielectric layer GI4a and a fourth left channel layer CH4a may be disposed on the base insulation layer 110 to sequentially, in the x-direction, cover a left sidewall surface of the fourth global gate line structure GGL4. In addition, although not illustrated in FIGS. 5A, 5B, 6A and 6B, a fourth right gate dielectric layer and a fourth right channel layer may be disposed on the base insulation layer 110 to sequentially, in the x-direction, cover a right sidewall surface of the fourth global gate line structure GGL4.

Meanwhile, a first bit line structure BL1, a first resistance change structure RC1, a second bit line structure BL2, and a second resistance change structure RC2 may be disposed to be spaced apart from each other in the y-direction, between the first global gate line structure GGL1 and the second global gate line structure GGL2. The first bit line structure BL1, the first resistance change structure RC1, the second bit line structure BL2, and the second resistance change structure RC2 may each be disposed in a pillar shape extending in the first direction (i.e., the z-direction) from the base insulation layer 110.

The first bit line structure BL1, the first resistance change structure RC1, the second bit line structure BL2, and the second resistance change structure RC2 may be disposed to contact the first right channel layer CH1b and the second left channel layer CH2a along the third direction (i.e., the x-direction). In addition, first insulation structures IL1 may be disposed between the first bit line structure BL1 and the first resistance change structure RC1; between the first resistance change structure RC1 and the second bit line structure BL2; and between the second bit line structure BL2 and the second resistance change structure RC2.

The first source line structure SL1 may be disposed inside the first resistance change structure RC1. Likewise, the second source line structure SL2 may be disposed inside the second resistance change structure RC2. The first and second source line structures SL1 and SL2 may each extend in the first direction (i.e., the z-direction) from the base insulation layer 110.

Referring to FIGS. 5A, 5B, 6A and 6B, the third bit line structure BL3, the third resistance change structure RC3, the fourth bit line structure BL4 and the fourth resistance change structure RC4 may be disposed to be spaced apart from each other along the second direction (i.e., the y-direction) between the second global gate line structure GGL2 and the third global gate line structure GGL3. The third bit line structure BL3, the third resistance change structure RC3, the fourth bit line structure BL4 and the fourth resistance change structure RC4 may each be disposed in a pillar shape extending in the first direction (i.e., the z-direction) on the base insulation layer 110.

The third bit line structure BL3, the third resistance change structure RC3, the fourth bit line structure BL4 and the fourth resistance change structure RC4 may be disposed to contact the second right channel layer CH2b and the third left channel layer CH3a along the third direction (i.e., the x-direction). In addition, second insulation structures IL2 may be disposed between the third bit line structure BL3 and the third resistance change structure RC3; between the third resistance change structure RC3 and the fourth bit line structure BL4; and between the fourth bit line structure BL4 and the fourth resistance change structure RC4.

The third source line structure SL3 may be disposed inside the third resistance change structure RC3. Likewise, the fourth source line structure SL4 may be disposed inside the fourth resistance change structure RC4. The third and fourth source line structures SL3 and SL4 may each extend in the first direction (i.e., the z-direction) on the base insulation layer 110.

In an embodiment, the third bit line structure BL3 may be disposed not to overlap, or to only partially overlap, with the first bit line structure BL1 along the third direction (i.e., the x-direction). The fourth bit line structure BL4 may be disposed not to overlap, or to only partially overlap, with the second bit line structure BL2 along the third direction (i.e., the x-direction). For example, the third bit line structure BL3 may be offset from the first bit line structure BL1 in the y-direction. Similarly, the fourth bit line structure BL4 may be offset from the second bit line structure BL2 in the y-direction.

In addition, the third resistance change structure RC3 and the third source line structure SL3 may be disposed not to overlap, or to only partially overlap, with the first resistance change structure RC1 and the first source line structure SL1, respectively, along the third direction (i.e., the x-direction). The fourth resistance change structure RC4 and the fourth source line structure SL4 may be disposed not to overlap, or to only partially overlap, with the second resistance change structure RC2 and the second source line structure SL2, respectively, along the third direction (i.e., the x-direction). For example, the third resistance change structure RC3 and the third source line structure SL3 may be offset from the first resistance change structure RC1 and the first source line structure SL1 in the y-direction. Similarly, the fourth resistance change structure RC4 and the fourth source line structure SL4 may be offset from the second resistance change structure RC2 and the second source line structure SL2 in the y-direction.

Referring to FIGS. 5A, 5B, 6A and 6B, the fifth bit line structure BL5, the fifth resistance change structure RC5, the sixth bit line structure BL6, and the sixth resistance change structure RC6 may be disposed to be spaced apart from each other along the second direction (i.e., the y-direction), between the third global gate line structure GGL3 and the fourth global gate line structure GGL4. The fifth bit line structure BL5, the fifth resistance change structure RC5, the sixth bit line structure BL6, and the sixth resistance change structure RC6 may each be disposed in a pillar shape extending in the first direction (i.e., the z-direction) on the base insulation layer 110.

The fifth bit line structure BL5, the fifth resistance change structure RC5, the sixth bit line structure BL6, and the sixth resistance change structure RC6 may be disposed to contact the third right channel layer CH3b and the fourth left channel layer CH4a along the third direction (i.e., the x-direction). In addition, third insulation structures IL3 may be disposed between the fifth bit line structure BL5 and the fifth resistance change structure RC5; between the fifth resistance change structure RC5 and the sixth bit line structure BL6; and between the sixth bit line structure BL6 and the sixth resistance change structure RC6.

The fifth source line structure SL5 may be disposed inside the fifth resistance change structure RC5. Likewise, the sixth source line structure SL6 may be disposed inside the sixth resistance change structure RC6. The fifth and sixth source line structures SL5 and SL6 may extend in the first direction (i.e., the z-direction) on the base insulation layer 110.

In an embodiment, the fifth bit line structure BL5 may be disposed not to overlap, or to only partially overlap, with the third bit line structure BL3 along the third direction (i.e., the x-direction). The fifth bit line structure BL5 may be disposed to overlap with the first bit line structure BL1 in the x-direction. For example, the fifth bit line structure BL5 may be offset from the third bit line structure BL3 in the y-direction. Referring to FIGS. 5A and 6A, the first bit line structure BL1 and the fifth bit line structure BL5 may be electrically connected to the second global bit line structure GBL2, which is disposed to extend in the third direction (i.e., the x-direction) over the substrate 101. In an embodiment, the second global bit line structure GBL2 may be disposed over the first and fifth bit line structures BL1 and BL5.

Meanwhile, the third bit line structure BL3 may be electrically connected to the first global bit line structure GBL1, which is disposed to extend in the third direction (i.e., the x-direction) over the substrate 101. The first global bit line structure GBL1 may be disposed to be spaced apart from the second global bit line structure GBL2 in the second direction (i.e., the y-direction).

Likewise, in an embodiment, the sixth bit line structure BL6 may be disposed not to overlap, or to only partially overlap, with the fourth bit line structure BL4 along the third direction (i.e., the x-direction). The sixth bit line structure BL6 may be disposed to overlap with the second bit line structure BL2 in the x-direction. For example, the sixth bit line structure BL6 may be offset from the fourth bit line structure BL4 in the y-direction. The second bit line structure BL2 and the sixth bit line structure BL6 may be electrically connected to the fourth global bit line structure GBL4, which is disposed to extend in the third direction (i.e., the x-direction) over the substrate 101. In an embodiment, the fourth global bit line structure GBL4 may be disposed over the second and the sixth bit line structures BL2 and BL6.

Meanwhile, the fourth bit line structure BL4 may be electrically connected to the third global bit line structure GBL3, which is disposed to extend in the third direction (i.e., the x-direction) over the substrate 101. The third global bit line structure GBL3 may be disposed to be spaced apart from the fourth global bit line structure GBL4 in the second direction (i.e., the y-direction).

In an embodiment, the fifth resistance change structure RC5 and the fifth source line structure SL5 may be disposed not to overlap, or to only partially overlap, with the third resistance change structure RC3 and the third source line structure SL3, respectively, along the third direction (i.e., the x-direction). The fifth resistance change structure RC5 and the fifth source line structure SL5 may be disposed to overlap with the first resistance change structure RC1 and the first source line structure SL1 in the x-direction. The first source line structure SL1 and the fifth source line structure SL5 may be electrically connected to the second global source line structure GSL2, which is disposed to extend in the third direction (i.e., the x-direction) over the substrate 101. In an embodiment, the second global source line structure GSL2 may be disposed over the first and fifth source line structures SL1 and SL5.

Meanwhile, the third source line structure SL3 may be electrically connected to the first global source line structure GSL1, which is disposed to extend in the third direction (i.e., the x-direction) over the substrate 101. The first global source line structure GSL1 may be disposed to be spaced apart from the second global source line structure GSL2 in the second direction (i.e., the y-direction).

Likewise, in an embodiment, the sixth resistance change structure RC6 and the sixth source line structure SL6 may be disposed not to overlap, or to only partially overlap, with the fourth resistance change structure RC4 and the fourth source line structure SL4, respectively, along the third direction (i.e., the x-direction). The sixth resistance change structure RC6 and the sixth source line structure SL6 may be disposed to overlap with the second resistance change structure RC2 and the second source line structure SL2 in the x-direction. The second source line structure SL2 and the sixth source line structure SL6 may be electrically connected to the fourth global source line structure GSL4, which is disposed to extend in the third direction (i.e., the x-direction) over the substrate 101. In an embodiment, the fourth global source line structure GSL4 may be disposed over the second and sixth source line structures SL2 and SL6.

Meanwhile, the fourth source line structure SL4 may be electrically connected to the third global source line structure GSL3, which is disposed to extend in the third direction (i.e., the x-direction) over the substrate 101. The third global source line structure GSL3 may be disposed to be spaced apart from the fourth global source line structure GSL4 in the second direction (i.e., the y-direction).

Consequently, referring again to FIGS. 5A and 5B, the first bit line structure BL1, the third bit line structure BL3, and the fifth bit line structure BL5 may zigzag with respect to each other along the third direction (i.e., the x-direction). Likewise, the second bit line structure BL2, the fourth bit line structure BL4, and the sixth bit line structure BL6 may zigzag with respect to each other along the third direction (i.e., the x-direction). In addition, the first resistance change structure RC1, the third resistance change structure RC3, and the fifth resistance change structure RC5 may zigzag with respect to each other along the third direction (i.e., the x-direction). Likewise, the second resistance change structure RC2, the fourth resistance change structure RC4, and the sixth resistance change structure RC6 may zigzag with respect to each other along the third direction (i.e., the x-direction). In addition, the first source line structure SL1, the third source line structure SL3, and the fifth source line structure SL5 may zigzag with respect to each other along the third direction (i.e., the x-direction). Likewise, the second source line structure SL2, the fourth source line structure SL4, and the sixth source line structure SL6 may zigzag with respect to each other along the third direction (i.e., the x-direction).

Referring again to FIGS. 5A, 5B, 6A and 6B, the nonvolatile memory device having the first to sixth units A1, A2, A3, A4, A5 and A6 may perform a randomly-accessible memory operation as follows. As an exemplary example, an operation of the first unit A1 will be schematically described. First, the fourth gate electrode layer pattern 1124d of the second global gate line structure GGL2 may be selected.

When a switching voltage equal to or greater than a predetermined threshold voltage is applied to the fourth gate electrode layer pattern 1124d, conductive channels may be formed in portions of the second left channel layer CH2a and in the second right channel layer CH2b that overlap the fourth gate electrode layer pattern 1124d, respectively, along the x-direction. Accordingly, the conductive channels may be formed to cover the first to fourth units A1, A2, A3 and A4 along the second direction (i.e., the y-direction).

At this time, a write voltage or a read voltage may be applied between the second global bit line structure GBL2 and the second global source line structure GSL2. On the other hand, the write voltage or the read voltage may be controlled and not applied between the first global bit line structure GBL1 and the first global source line structure GSL1, between the third global bit line structure GBL3 and the third global source line structure GSL3, between the fourth global bit line structure GBL4 and the fourth global source line structure GSL4, and between the second global source line structure GSL2 and the fourth global bit line structure GBL4. That is, the electric potentials of the first, third and fourth global bit line structures GBL1, GBL3 and GBL4 and the electric potentials of the first, third and fourth global source line structures GSL1, GSL3 and GSL4 may be controlled, respectively.

Accordingly, the applied write voltage or read voltage may be applied to an operation region of the first resistance change structure RC1 positioned between the first source line structure SL1 and the second left channel layer CH2a. In addition, a write operation or a read operation may be performed on the operation area. The write and read operations are substantially the same as the write and read operations described above with reference to FIGS. 4A and 4B.

According to above-described embodiments of the present disclosure, a resistance change structure in a nonvolatile memory device may be divided into two operation regions, and the two operation regions can independently perform memory operations. That is, each of the two operation regions may each correspond to a memory cell. Accordingly, the memory cell density of nonvolatile memory devices can be increased.

According to embodiments disclosed herein and contemplated by the disclosure, a plurality of memory cells can be configured by three-dimensional arranging of gate line structures, bit line structures, resistance change structures, source line structures, gate dielectric layers, and channel layers on a substrate. In addition, it is possible to provide nonvolatile memory devices capable of randomly accessing the plurality of memory cells by separately or independently controlling voltages applied to the respective gate line structures, the bit line structures, and the source line structures.

FIGS. 7 to 13 are views schematically illustrating a method of manufacturing a nonvolatile memory device according to an embodiment of the present disclosure. In an embodiment, FIGS. 7 to 13 may describe a process of forming the nonvolatile memory device illustrated in FIG. 6A.

Figure 7:
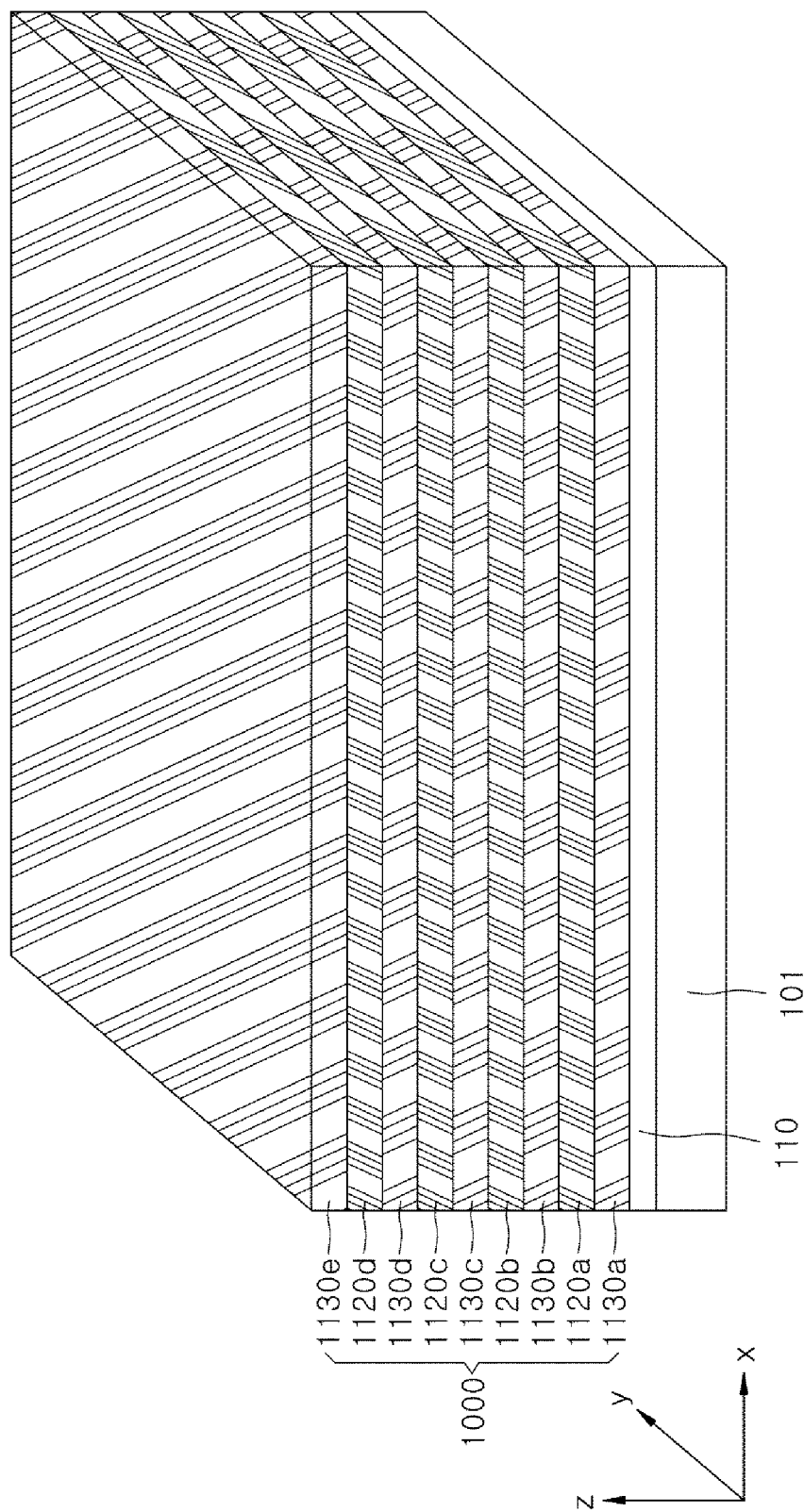
FIGS. 7 to 13 are views schematically illustrating a method of manufacturing a nonvolatile memory device according to an embodiment of the present disclosure.

Referring to FIG. 7, a substrate 101 may be prepared. The substrate 101 may include a semiconductor material. Specifically, the semiconductor material may include, for example, silicon (Si), germanium (Ge), gallium arsenide (GaAs), and the like. The substrate 101 may be doped with an n-type dopant or a p-type dopant. As an example, the substrate 101 may include a well region doped with an n-type dopant or a p-type dopant.

Subsequently, a base insulation layer 110 may be formed on the substrate 101. The base insulation layer 110 may include, for example, oxide, nitride, or oxynitride. The base insulation layer 110 may be formed, for example, by chemical vapor deposition, physical vapor deposition, atomic layer deposition, and the like.

Although not illustrated in FIG. 7, at least one conductive layer and at least one insulation layer may be formed between the substrate 101 and the base insulation layer 110 using a conventional integrated circuit technology. The conductive layer and the insulation layer may form various circuit patterns. That is, the conductive layer and the insulation layer may form a wiring of multiple layers, or may constitute a passive element such as a capacitor or a resistor, or an active element such as a diode or a transistor.

Referring again to FIG. 7, a gate stack structure 1000 may be formed on the base insulation layer 110. The gate stack structure 1000 may be formed by alternately stacking first to fourth conductive layers 1120a, 1120b, 1120c and 1120d and first to fifth interlayer insulation layers 1130a, 1130b, 1130c, 1130d and 1130e on the base insulation layer 110. At this time, the first interlayer insulation layer 1130a may contact the base insulation layer 110 and the fifth interlayer insulation layer 1130e may be disposed as an uppermost layer of the gate stack structure 1000. As a method of forming the first to fourth conductive layers 1120a, 1120b, 1120c and 1120d, a chemical vapor deposition method, a physical vapor deposition method, an atomic layer deposition method, and the like may be used, by way of examples. As a method of forming the first to fifth interlayer insulation layers 1130a, 1130b, 1130c, 1130d and 1130e, a chemical vapor deposition method, a physical vapor deposition method, an atomic layer deposition method, and the like may be similarly used.

Figure 8:
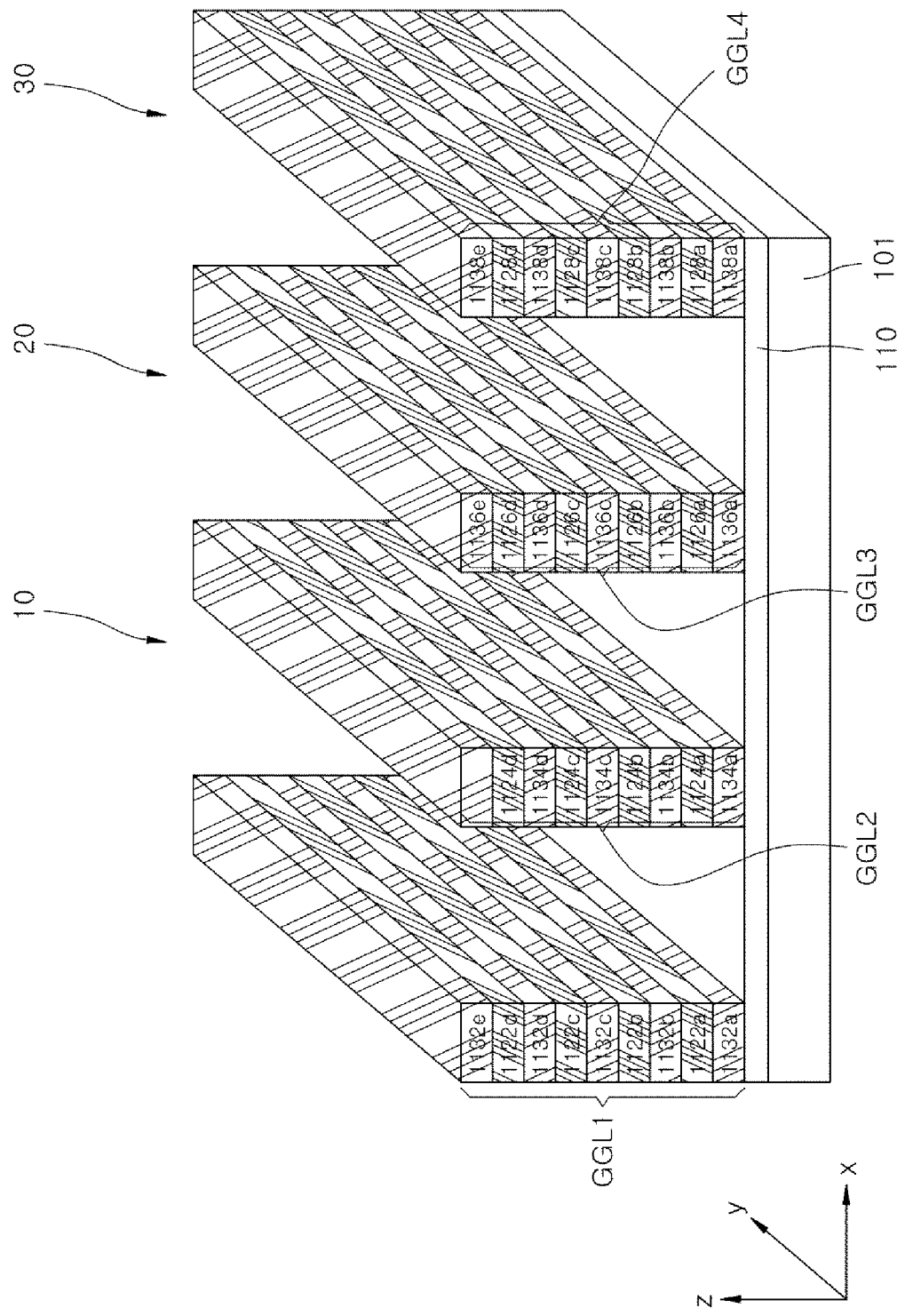

Referring to FIG. 8, the gate stack structure 1000 may be patterned to form first to third trench lines 10, 20 and 30 exposing the base insulation layer 110. The first to third trench lines 10, 20 and 30 may penetrate the gate stack structure 1000 in a first direction (i.e., the z-direction) and extend in the second direction (i.e., the y-direction).

By the first to third trench lines 10, 20 and 30, first to fourth global gate line structures GGL1, GGL2, GGL3 and GGL4 may be formed. The first to fourth global gate line structures GGL1, GGL2, GGL3 and GGL4 may be disposed to be spaced apart from each other in a third direction (i.e., the x-direction) and may each be disposed in parallel in the second direction (i.e., the y-direction). The first global gate line structure GGL1 may include first to fourth gate electrode layer patterns 1122a, 1122b, 1122c and 1122d and first to fifth interlayer insulation layer patterns 1132a, 1132b, 1132c, 1132d and 1132e, which are alternately stacked along the first direction (i.e., the z-direction) on the base insulation layer 110. The second global gate line structure GGL2 may include first to fourth gate electrode layer patterns 1124a, 1124b, 1124c and 1124d and first to fifth interlayer insulation layer patterns 1134a, 1134b, 1134c, 1134d and 1134e, which are alternately stacked along the first direction (i.e., the z-direction) on the base insulation layer 110. The third global gate line structure GGL3 may include first to fourth gate electrode layer patterns 1126a, 1126b, 1126c and 1126d and first to fifth interlayer insulation layer patterns 1136a, 1136b, 1136c, 1136d and 1136e, which are alternately stacked along the first direction (i.e., the z-direction) on the base insulation layer 110. The fourth global gate line structure GGL4 may include first to fourth gate electrode layer patterns 1128a, 1128b, 1128c and 1128d and first to fifth interlayer insulation layer patterns 1138a, 1138b, 1138c, 1138d and 1138e, which are alternately stacked along the first direction (i.e., the z-direction) on the base insulation layer 110.

The gate stack structure 1000 may be patterned using a conventional lithography method and an etching method. As the etching method, a dry etch method, a wet etch method, or a combination thereof may be applied.

Figure 9:
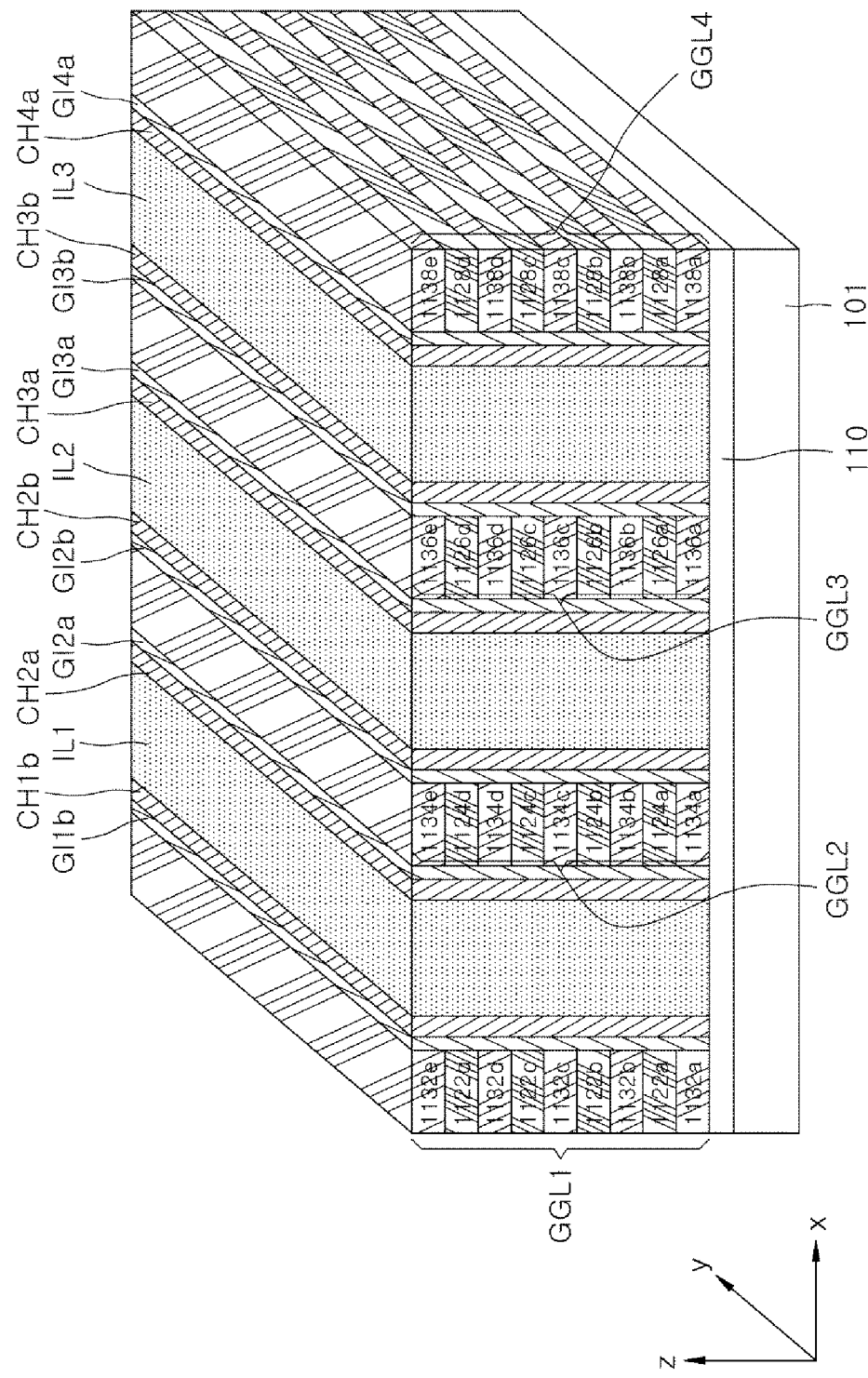

Referring to FIG. 9, gate dielectric layers GI1b, GI2a, GI2b, GI3a, GI3b and GI4a and channel layers CH1b, CH2a, CH2b, CH3a, CH3b and CH4a may be formed on the base insulation layer 110 and sequentially, in the x-direction, on sidewall surfaces of the first to fourth global gate line structures GGL1, GGL2, GGL3 and GGL4. Although not illustrated in FIG. 9, gate dielectric layers and channel layers may be similarly formed on a left sidewall surface of the first global gate line structure GGL1 and a right sidewall surface of the fourth global gate line structure GGL4. As illustrated, the sidewall surfaces may each formed parallel to a plane defined by the first direction (i.e., the z-direction) and the second direction (i.e., the y-direction).

In an embodiment, a method of sequentially forming the gate dielectric layers GI1b, GI2a, GI2b, GI3a, GI3b and GI4a and the channel layers CH1b, CH2a, CH2b, CH3a, CH3b CH4a may be performed as follows. First, a dielectric material film may be formed along inner wall surfaces of the first to third trench lines 10, 20 and 30 of FIG. 8. The dielectric material film may include, for example, silicon oxide, silicon nitride, silicon oxynitride, aluminum oxide, hafnium oxide, and the like. For example, the dielectric material layer may have a paraelectric property. As an example, the thickness of the dielectric layer may be 1 nanometer (nm) to 30 nanometers (nm), inclusive. As a method of forming the dielectric material film, for example, a chemical vapor deposition method, an atomic layer deposition method, or the like may be applied.

Subsequently, the dielectric material film formed on a bottom surfaces of the first to third trench lines 10, 20 and 30 and the dielectric material film formed outside the first to third trench lines 10, 20 and 30 may be selectively removed to form dielectric material layers. As a method of selectively removing the dielectric material film, for example, an etch-back method may be applied. As a result, the gate dielectric layers GI1b, GI2a, GI2b, GI3a, GI3b and GI4a, which are the dielectric material layers, may be formed on the sidewall surfaces of the first to fourth global gate line structures GGL1, GGL2, GGL3 and GGL4.

Subsequently, a channel material film having a predetermined thickness may be formed inside the first to third trench lines 10, 20 and 30 where the gate dielectric layers GI1b, GI2a, GI2b, GI3a, GI3b, and GI4a are formed. The channel material film may, for example, include a doped semiconductor material or metal oxide. The semiconductor material may, for example, include silicon (Si), germanium (Ge), gallium arsenide (GaAs), and the like. The metal oxide may include indium-gallium-zinc (In—Ga—Zn) oxide. In one embodiment, the channel material film may include silicon (Si) doped with an n-type dopant or germanium (Ge) doped with an n-type dopant. Alternatively, the channel material film may include c-axis aligned indium-gallium-zinc (In—Ga—Zn) oxide. As a method of forming the channel material film, for example, a chemical vapor deposition method, an atomic layer deposition method, and the like may be applied. As an example, the channel material film may have a thickness of 1 nanometer (nm) to 50 nanometers (nm), inclusive.

Subsequently, the channel material film formed on the bottom surface of the first to third trench lines 10, 20 and 30 and the channel material film formed outside the first to third trench lines 10, 20 and 30 are selectively removed to form a channel material layer. As a method of selectively removing the channel material layer, for example, an etch-back method may be applied. As a result, channel layers CH1b, CH2a, CH2b, CH3a, CH3b, and CH4a may be formed as the channel material layers on the sidewall surfaces of the gate dielectric layers GI1b, GI2a, GI2b, GI3a, GI3b and GI4a.

Subsequently, the first to third trench lines 10, 20 and 30, in which the gate dielectric layers GI1b, GI2a, GI2b, GI3a, GI3b and GI4a and channel layers CH1b, CH2a, CH2b, CH3a, CH3b and CH4a are formed, may be filled with an insulation material. The filling process with the insulation material may be performed, for example, using a chemical vapor deposition method, a physical vapor deposition method, a coating method, and the like. As a result, the first to third insulation structures IL1, IL2 and IL3 may be formed.

Figure 10:
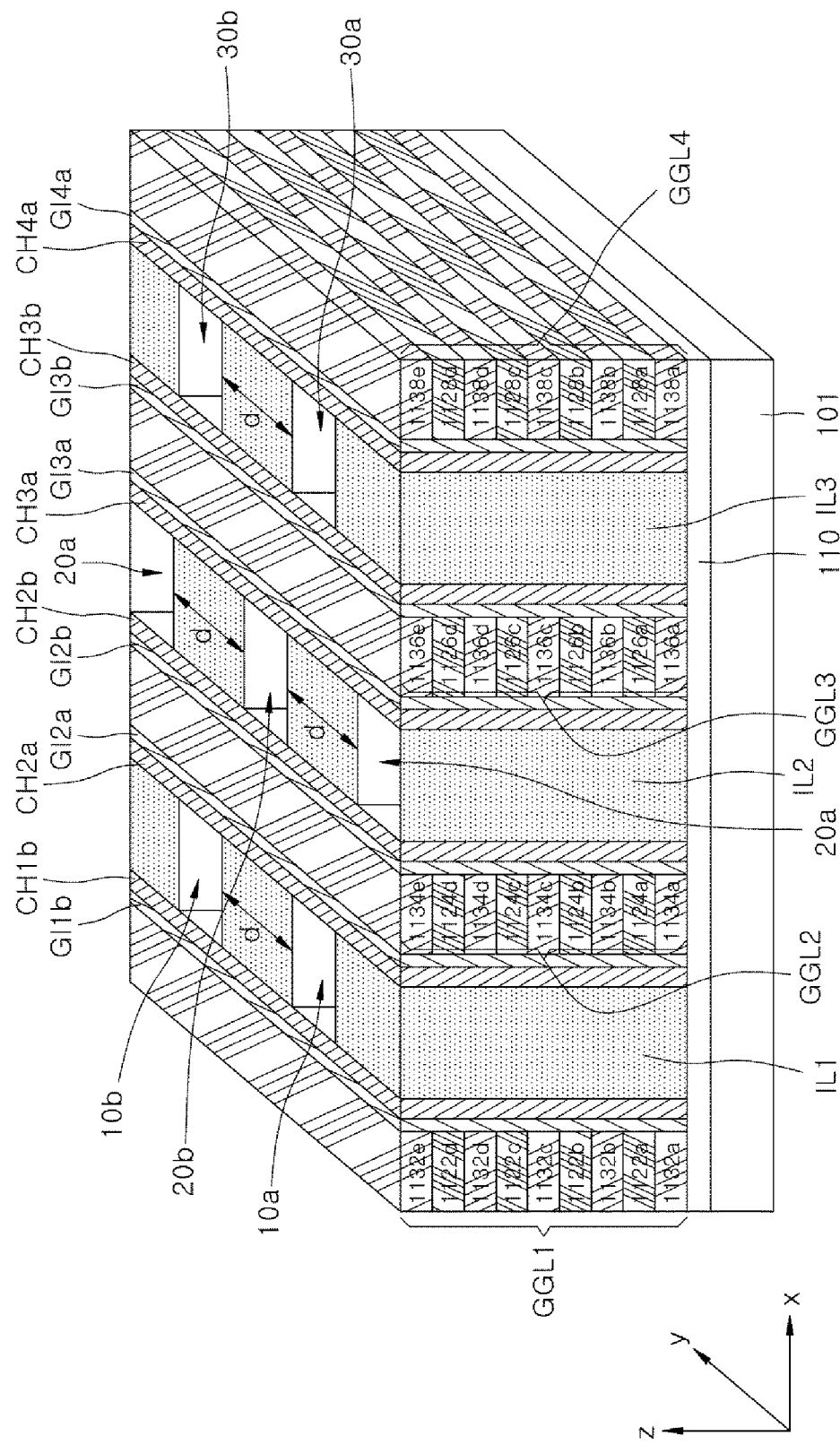

Referring to FIG. 10, the first to third insulation structures IL1, IL2 and IL3 may be patterned. In an embodiment, a first through hole 10a and a second through hole 10b may be alternately formed in the first insulation structure IL1 along the second direction (i.e., the y-direction). In addition, a first through hole 20a and a second through hole 20b may be alternately formed in the second insulation structure IL2. In addition, a first through hole 30a and a second through hole 30b may be alternatively formed in the third insulation structure IL3. The first through holes 10a, 20a and 30a and the second through holes 10b, 20b and 30b may be formed to be spaced apart by a predetermined distance d, respectively, along the second direction (i.e., the y-direction).

The first through hole 10a of the first insulation structure IL1 and the first through hole 30a of the third insulation structure IL3 may be disposed to overlap each other along the third direction (i.e., the x-direction). The first through hole 10a of the first insulation structure IL1 and the first through hole 30a of the third insulation structure IL3 may be disposed so as not to overlap the first through hole 20a of the second insulation structure IL2 along the third direction (i.e., the x-direction).

In addition, the second through hole 10b of the first insulation structure IL1 and the second through hole 30b of the third insulation structure IL3 may be disposed to overlap each other along the third direction (i.e., the x-direction). The second through hole 10b of the first insulation structure IL1 and the second through hole 30b of the third insulation structure IL3 may be disposed so as not to overlap the second through hole 20b of the second insulating structure IL2 along the third direction (i.e., the x-direction).

Figure 11:
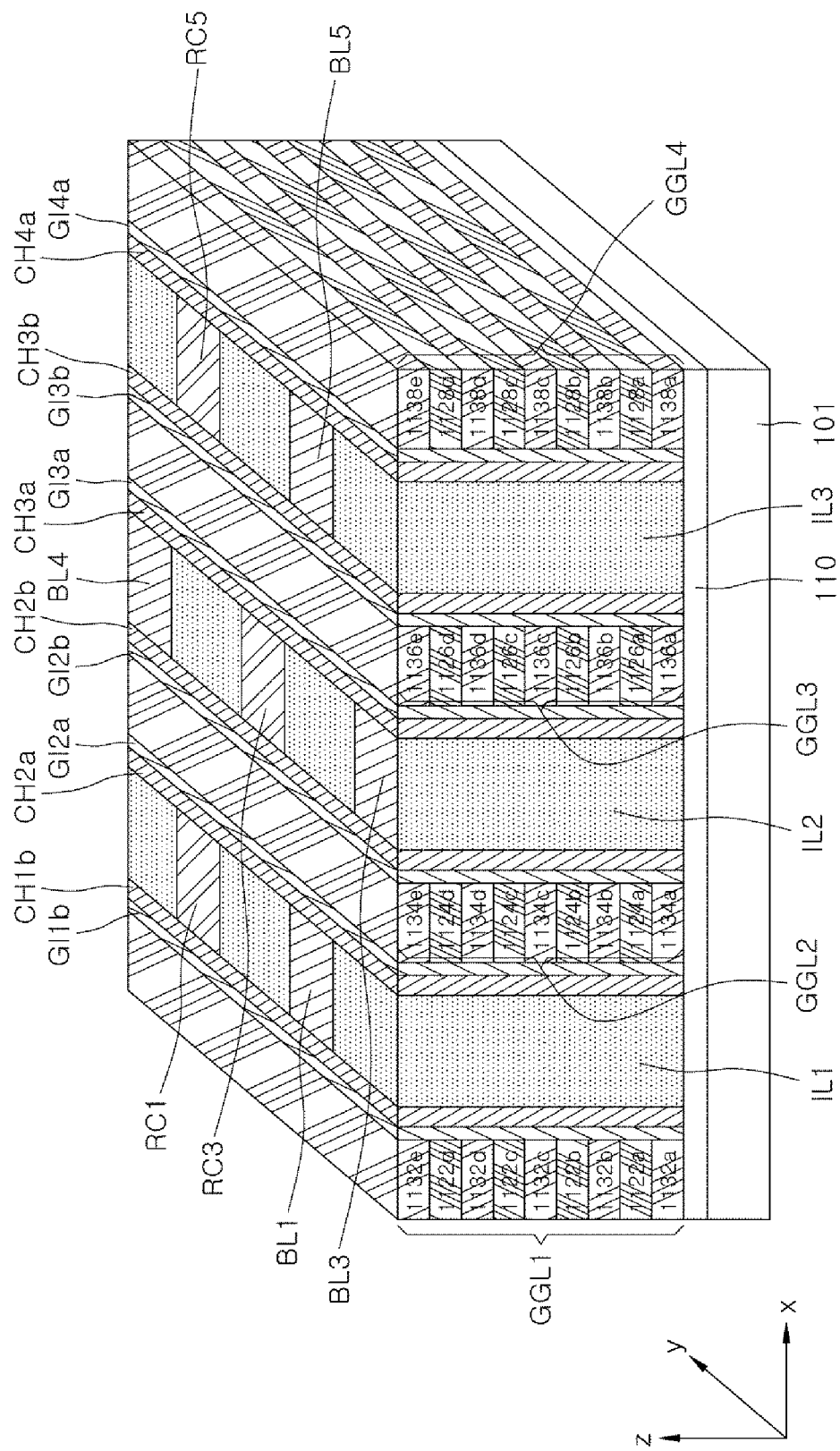

Referring to FIG. 11, the first through holes 10a, 20a and 30a may be filled with a conductive material to form bit line structures BL1, BL3, BL4 and BL5. The conductive material may, for example, include doped semiconductor material, metal, conductive metal nitride, conductive metal carbide, conductive metal silicide, or conductive metal oxide. The conductive material may, for example, include silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In an embodiment, the method of forming the bit line structures BL1, BL3, BL4 and BL5 may proceed as follows. As an example, a conductive material may be deposited inside and outside the first through holes 10a, 20a and 30a using chemical vapor deposition, physical vapor deposition, atomic layer deposition, and the like. Subsequently, the conductive material deposited outside the first through holes 10a, 20a and 30a may be removed using a planarization process. As an example of the planarization process, chemical mechanical polishing (CMP) or etch-back may be applied.

Referring back to FIG. 11, the second through holes 10b, 20b and 30b may be filled with a resistance change material to form resistance change structures RC1, RC3 and RC5. The resistance change material may include oxide having oxygen vacancies. The oxide may, for example, include titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. In another embodiment, the resistance change material may include PCMO ($Pr_{1-x}Ca_xMnO_3$, 0<x<1), LCMO ($La_{1-x}Ca_xMnO_3$, 0<x<1), BSCFO ($Ba_{0.5}Sr_{0.5}Co_{0.8}Fe_{0.2}O_{3-\delta}$), YBCO ($YB_{a2}Cu_3O_{7-x}$, 0<x<1), (Ba, Sr)$TiO_3$ doped with chromium (Cr) or niobium (Nb), $SrZrO_3$ doped with chromium (Cr) or vanadium (V), (La, Sr) $MnO_3$, $Sr_{1-x}La_xTiO_3$ (0<x<1), $La_{1-x}Sr_xFeO_3$ (0<x<1), $La_{1-x}Sr_xCoO_3$ (0<x<1), $SrFeO_{2.7}$, $LaCoO_3$, $RuSr_2GdCu_2O_3$, $YB_{a2}Cu_3O_7$, or a combination of two or more thereof. As another example, the resistance change material may include germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), $GexSe_{1-x}$ (0<x<1), silver sulfide ($Ag_2S$), copper sulfide ($Cu_2S$), Cadmium sulfide (CdS), zinc sulfide (ZnS), and selenium oxide ($CeO_2$), or a combination of two or more thereof.

In an embodiment, a method of forming the resistance change structures RC1, RC3 and RC5 may proceed as follows. As an example, a resistance change material may be deposited inside and outside the second through holes 10b, 20b and 30b using chemical vapor deposition, physical vapor deposition, atomic layer deposition, or the like. Subsequently, the resistance change material deposited outside the second through holes 10b, 20b and 30b may be removed using a planarization process. As an example of the planarization process, chemical mechanical polishing (CMP) or etch-back may be applied.

Figure 12:
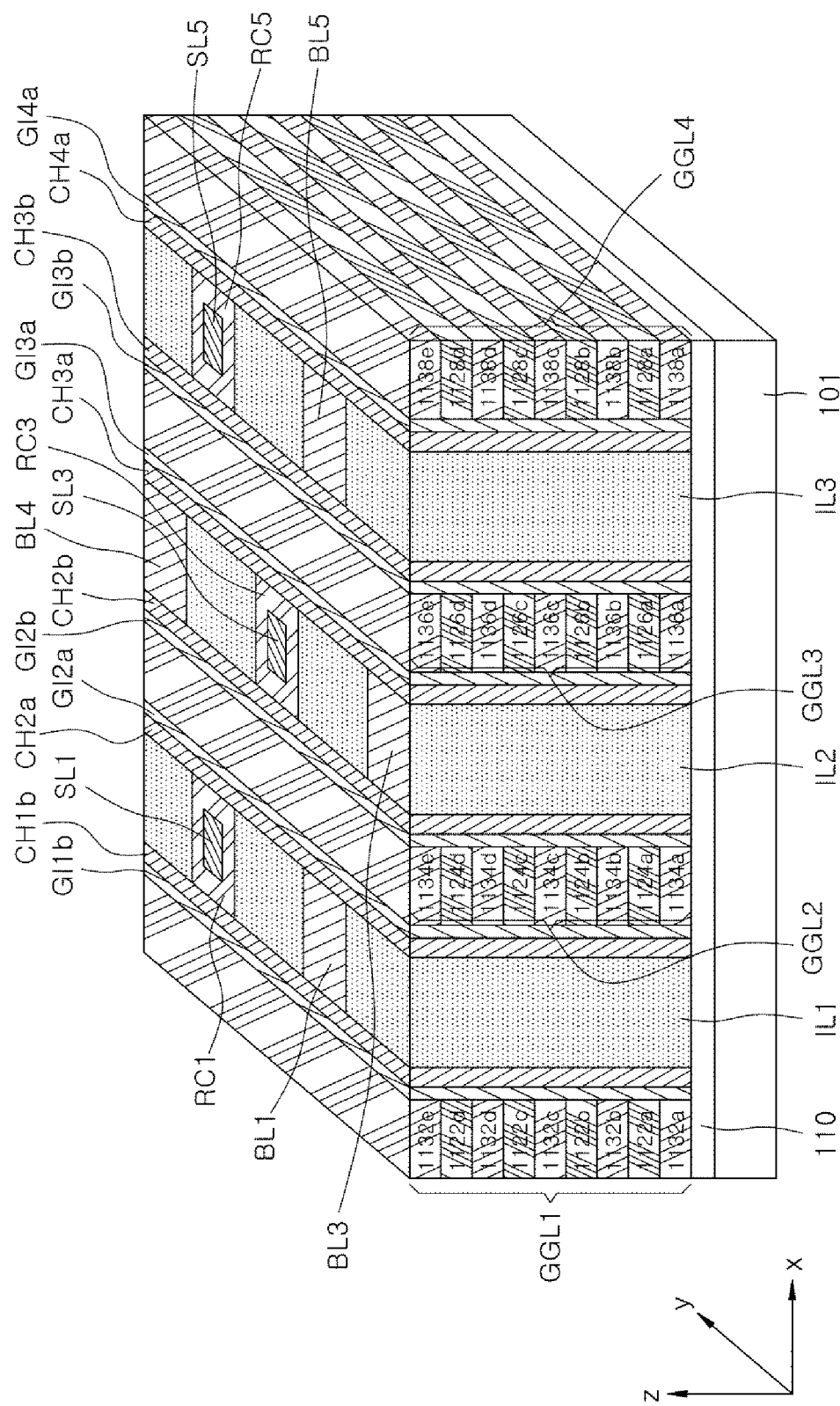

Referring to FIG. 12, the resistance change structures RC1, RC3 and RC5 may be patterned in the first direction (i.e., z-direction) to form third through holes (not shown) exposing the base insulation layer 110. Subsequently, the third through holes may be filled with a conductive material to form the source line structures SL1, SL3 and SL5. Specifically, a conductive material may be deposited inside and outside the third through holes using chemical vapor deposition, a physical vapor deposition, an atomic layer deposition, and the like. Subsequently, the conductive material deposited outside the third through holes may be removed using a planarization process. As an example of the planarization process, chemical mechanical polishing (CMP) or etch-back may be applied.

The conductive material may, for example, include a doped semiconductor material, metal, conductive metal nitride, conductive metal carbide, conductive metal silicide, or conductive metal oxide. The conductive material may, for example, include silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Figure 13:
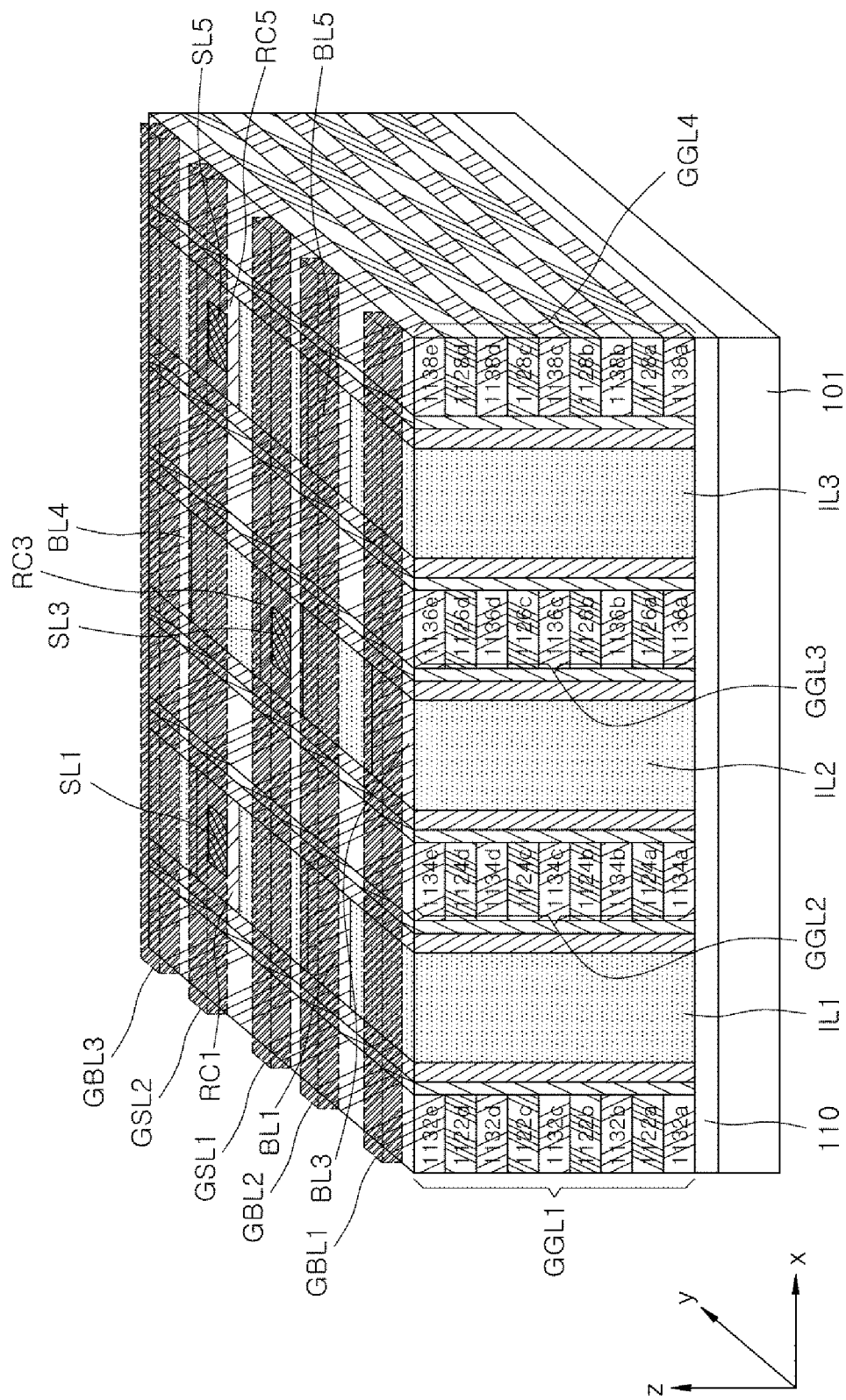

Referring to FIG. 13, global bit line structures GBL1, GBL2 and GBL3 and global source line structures GSL1 and GSL2 extending in the third direction (i.e., the x-direction) may be formed on the bit line structures BL1, BL2, BL3 and BL4 and the source line structures SL1, SL3 and SL5. As illustrated in FIG. 13, the second global bit line structure GBL2 may contact the first and fifth bit line structures BL1 and BL5. The second global source line structure GSL2 may be formed to contact the first and fifth source line structures SL1 and SL5. The first global bit line structure GBL1 may be formed to contact the third bit line structure BL3, and the first global source line structure GSL1 may be formed to contact the third source line structures SL3. The third global bit line structure GBL3 may contact the fourth bit line structure BL4.

As a method of forming the global bit line structures GBL1, GBL2 and GBL3 and the global source line structures GSL1 and GSL2, a method of forming a conductive material layer on the bit line structures BL1, BL3, BL4 and BL5 and the source line structures SL1, SL3 and SL5 and patterning the conductive material layer may be applied. As a method of forming the conductive material layer, for example, a chemical vapor deposition method, a physical vapor deposition method, an atomic layer deposition method, or the like may be applied. As a patterning method, after the lithography process, an etching process applying, for example, dry etching, wet etching, or a combination thereof may be applied.

Through the above-described processes, a nonvolatile memory device according to an embodiment of the present disclosure may be manufactured.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A nonvolatile memory device comprising:
a substrate having an upper surface;
a gate line structure disposed over the substrate, the gate line structure comprising at least one gate electrode layer pattern and at least one interlayer insulation layer pattern which are alternately stacked along a first direction perpendicular to the upper surface, wherein the gate line structure extends in a second direction perpendicular to the first direction;
a gate dielectric layer covering one sidewall surface of the gate line structure and disposed over the substrate, the one sidewall surface of the gate line structure being a plane defined by the first and second directions;
a channel layer disposed to cover the gate dielectric layer and disposed over the substrate;
a bit line structure and a resistance change structure, each disposed over the substrate and extending along the first direction to contact different portions of the channel layer; and
a source line structure disposed in the resistance change structure and extending along the first direction,
wherein the bit line structure and the resistance change structure are disposed to be spaced apart from each other in the second direction.

2. The nonvolatile memory device of claim 1, wherein the source line structure and the channel layer are disposed to be spaced apart from each other in the third direction by a predetermined distance.

3. The nonvolatile memory device of claim 1, wherein each of the bit line structure, the resistance change structure, and the source line structure has a pillar shape over the substrate.

4. The nonvolatile memory device of claim 1, wherein the resistance change structure comprises an oxide having oxygen vacancies, and wherein the oxide is at least one oxide selected from the group consisting of titanium oxide, aluminum oxide, nickel oxide, copper oxide, zirconium oxide, manganese oxide, hafnium oxide, tungsten oxide, tantalum oxide, niobium oxide, and iron oxide.

5. The nonvolatile memory device of claim 1, wherein the resistance change structure comprises at least one selected from the group consisting of PCMO ($Pr_{1-x}Ca_xMnO_3$, $0<x<1$), LCMO ($La_{1-x}Ca_xMnO_3$, $0<x<1$), BSCFO ($Ba_{0.5}Sr_{0.5}Co_{0.8}Fe_{0.2}O_{3-\delta}$), YBCO ($YB_{a2}Cu_3O_{7-x}$, $0<x<1$), (Ba, Sr)$TiO_3$ doped with chromium (Cr) or niobium (Nb), $SrZrO_3$ doped with chromium (Cr) or vanadium (V), (La, Sr) $MnO_3$, $Sr_{1-x}La_xTiO_3$ ($0<x<1$), $La_{1-x}Sr_xFeO_3$ ($0<x<1$), $La_{1-x}Sr_xCoO_3$ ($0<x<1$), $SrFeO_{2.7}$, $LaCoO_3$, $RuSr_2GdCu_2O_3$, and $YB_{a2}Cu_3O_7$.

6. The nonvolatile memory device of claim 1, wherein the resistance change structure comprises at least one selected from the group consisting of germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), GexSe1-x ($0<x<1$), silver sulfide ($Ag_2S$), copper sulfide ($Cu_2S$), Cadmium sulfide (CdS), zinc sulfide (ZnS), and selenium oxide ($CeO_2$).

7. The nonvolatile memory device of claim 1, wherein the channel layer comprises a semiconductor material.

8. The nonvolatile memory device of claim 1, wherein the gate dielectric layer is disposed to cover a sidewall surface of the gate electrode layer pattern and a sidewall surface of the interlayer insulation layer pattern.

9. The nonvolatile memory device of claim 1, further comprising:
an insulation structure disposed between the bit line structure and the resistance change structure and disposed over the substrate and to extend in the first direction.

10. A nonvolatile memory device comprising:
a substrate having an upper surface;
a first gate line structure and a second gate line structure disposed over the substrate, each of the first and second gate line structures comprising at least one gate electrode layer pattern and at least one interlayer insulation layer pattern that are alternately stacked along a first direction perpendicular to the upper surface, wherein the first and second gate line structures extend in a second direction perpendicular to the first direction and are disposed to be spaced apart from each other in a third direction perpendicular to the first and second directions;
a first gate dielectric layer and a first channel layer sequentially disposed on a sidewall surface of the first gate line structure along the third direction;
a second gate dielectric layer and a second channel layer sequentially disposed on a sidewall surface of the second gate line structure along the third direction;
a first bit line structure and a first resistance change structure disposed between the first gate line structure and the second gate line structure over the substrate and disposed to contact the first and second channel layers, respectively; and
a first source line structure disposed in the first resistance change structure to extend along the first direction,
wherein the first bit line structure and the first resistance change structure are disposed to be spaced apart from each other along the second direction by a predetermined distance.

11. The nonvolatile memory device of claim 10,
wherein the first source line structure and the first channel layer, and the first source line structure and the second channel layer are respectively disposed to be spaced apart from each other in the third direction by a predetermined distance.

12. The nonvolatile memory device of claim 10, wherein each of the first bit line structure, the first resistance change structure, and the first source line structure has a pillar shape over the substrate.

13. The nonvolatile memory device of claim 10, further comprising:
a first insulation structure disposed to extend along the first direction over the substrate and to separate the first bit line structure and the first resistance change structure from each other along the second direction.

14. The nonvolatile memory device of claim 10, further comprising:
- a third gate line structure disposed over the substrate to be spaced apart from the first gate line structure and extending in the second direction;
- a third gate dielectric layer and a third channel layer sequentially disposed on a sidewall surface of the third gate line structure along the third direction;
- a fourth gate line structure disposed over the substrate to be spaced apart from the second gate line structure and extending in the second direction; and
- a fourth gate dielectric layer and a fourth channel layer sequentially disposed on a sidewall surface of the fourth gate line structure along the third direction.

15. The nonvolatile memory device of claim 14, further comprising:
- a second bit line structure and a second resistance change structure that are disposed between the first gate line structure and the third gate line structure over the substrate and disposed to be spaced apart from each other along the second direction by a second distance; and
- a third bit line structure and a third resistance change structure that are disposed between the second gate line structure and the fourth gate line structure over the substrate and disposed to be spaced apart from each other along the second direction by the second distance.

16. The nonvolatile memory device of claim 15, wherein the second bit line structure and the second resistance change structure contact the first and third channel layers, respectively, and
- wherein the third bit line structure and the third resistance change structure contact the second and fourth channel layers, respectively.

17. The nonvolatile memory device of claim 15, further comprising:
- a second source line structure disposed to extend along the first direction in the second resistance change structure; and
- a third source line structure disposed to extend along the first direction in the third resistance change structure.

18. The nonvolatile memory device of claim 15, wherein the first to third bit line structures are disposed to be zigzagged along the third direction, and wherein the first to third resistance change structures are disposed to be zigzagged along the third direction.

* * * * *